(12) United States Patent
Obata et al.

(10) Patent No.: US 12,477,815 B2
(45) Date of Patent: *Nov. 18, 2025

(54) SEMICONDUCTOR DEVICE

(71) Applicant: FUJI ELECTRIC CO., LTD., Kanagawa (JP)

(72) Inventors: Tomoyuki Obata, Matsumoto (JP); Soichi Yoshida, Matsumoto (JP); Tetsutaro Imagawa, Matsumoto (JP); Seiji Momota, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/476,284

(22) Filed: Sep. 27, 2023

(65) Prior Publication Data

US 2024/0021607 A1   Jan. 18, 2024

Related U.S. Application Data

(60) Continuation of application No. 17/577,048, filed on Jan. 17, 2022, now Pat. No. 11,810,914, which is a
(Continued)

(30) Foreign Application Priority Data

Dec. 14, 2017   (JP) .................... 2017-239713

(51) Int. Cl.
*H10D 84/80* (2025.01)
*H10D 12/00* (2025.01)
(Continued)

(52) U.S. Cl.
CPC ......... *H10D 84/811* (2025.01); *H10D 12/211* (2025.01); *H10D 62/133* (2025.01); *H10D 84/617* (2025.01)

(58) Field of Classification Search
CPC .. H10D 84/811; H10D 12/211; H10D 62/133; H10D 84/617; H10D 30/0512;
(Continued)

(56) References Cited

U.S. PATENT DOCUMENTS 10,256,234 B2   4/2019   Tanabe
10,636,877 B2 * 4/2020   Naito ................. H01L 29/0619
(Continued)

FOREIGN PATENT DOCUMENTS

CN   107180855 A   9/2017
DE   112011105319 T5   3/2014
(Continued)

OTHER PUBLICATIONS

Office Action issued for related German Application 112018006404.2, transmitted from the German Patent and Trademark Office on Aug. 14, 2024 (issued on Aug. 7, 2024).
(Continued)

*Primary Examiner* — Mohammed Shamsuzzaman

(57) ABSTRACT

Provided is a semiconductor device having transistor and diode sections. The semiconductor device comprises: a gate metal layer provided above the upper surface of a semiconductor substrate; an emitter electrode provided above the upper surface of the semiconductor substrate; a first conductivity-type emitter region provided on the semiconductor substrate upper surface side in the transistor section; a gate trench section, which is provided on the semiconductor substrate upper surface side in the transistor section, is electrically connected to the gate metal layer, and is in contact with the emitter region; an emitter trench section, which is provided on the semiconductor substrate upper surface side in the diode section, and is electrically connected to the emitter electrode; and a dummy trench section, which is provided on the semiconductor substrate upper
(Continued)

surface side, is electrically connected to the gate metal layer, and is not in contact with the emitter region.

29 Claims, 28 Drawing Sheets

Related U.S. Application Data division of application No. 16/693,367, filed on Nov. 24, 2019, now Pat. No. 11,239,234, which is a continuation of application No. PCT/JP2018/037481, filed on Oct. 5, 2018.

(51) Int. Cl.
*H10D 62/13* (2025.01)
*H10D 84/60* (2025.01)

(58) Field of Classification Search
CPC .... H10D 44/466; H10D 48/40; H10D 62/605; A23B 75/00; A61K 40/436; H02K 15/40; H02K 15/90; H10H 20/835; H01L 2224/0603
See application file for complete search history.

(56) References Cited

U.S. PATENT DOCUMENTS

| | | | |
|---|---|---|---|
| 2001/0054738 A1 | 12/2001 | Momota | |
| 2004/0084722 A1* | 5/2004 | Yamaguchi | H01L 29/66348 257/E21.384 |
| 2009/0001411 A1 | 1/2009 | Tokura | |
| 2009/0020852 A1* | 1/2009 | Harada | H01L 29/7397 257/579 |
| 2010/0289076 A1 | 11/2010 | Tomoyuki | |
| 2011/0012195 A1 | 1/2011 | Momota | |
| 2013/0075784 A1 | 3/2013 | Ikeda | |
| 2014/0084335 A1 | 3/2014 | Senoo | |
| 2015/0270387 A1* | 9/2015 | Kumada | H10D 12/481 257/140 |
| 2016/0247808 A1 | 8/2016 | Horiuchi | |
| 2016/0293595 A1 | 10/2016 | Narazaki | |
| 2016/0336404 A1* | 11/2016 | Naito | H10D 62/393 |
| 2016/0372585 A1 | 12/2016 | Furukawa | |
| 2017/0018547 A1* | 1/2017 | Naito | H10D 84/811 |
| 2017/0018636 A1* | 1/2017 | Naito | H10D 62/127 |
| 2017/0047322 A1* | 2/2017 | Yoshida | H01L 29/78 |
| 2017/0236908 A1 | 8/2017 | Naito | |
| 2017/0263740 A1 | 9/2017 | Onozawa | |
| 2017/0301779 A1* | 10/2017 | Naito | H01L 29/7397 |
| 2017/0317175 A1* | 11/2017 | Naito | H01L 29/0834 |
| 2018/0005829 A1 | 1/2018 | Takishita | |
| 2018/0034265 A1 | 2/2018 | Matteo | |
| 2018/0158815 A1 | 6/2018 | Onozawa | |
| 2018/0182754 A1 | 6/2018 | Naito | |
| 2018/0323294 A1* | 11/2018 | Okuda | H10D 8/00 |
| 2018/0342605 A1* | 11/2018 | Dainese | H10D 12/038 |
| 2018/0366548 A1* | 12/2018 | Naito | H10D 64/62 |
| 2018/0374948 A1* | 12/2018 | Naito | H10D 12/461 |
| 2019/0181252 A1* | 6/2019 | Shirakawa | H10D 62/105 |
| 2019/0252532 A1* | 8/2019 | Taoka | H10D 89/105 |
| 2020/0098902 A1* | 3/2020 | Omura | H10D 62/127 |
| 2020/0388611 A1* | 12/2020 | Onozawa | H10D 64/519 |
| 2022/0216055 A1* | 7/2022 | Kubouchi | H01L 29/32 |
| 2022/0216056 A1* | 7/2022 | Uchida | H01L 29/7397 |

FOREIGN PATENT DOCUMENTS

| | | | |
|---|---|---|---|
| JP | H10107282 A | 4/1998 | |
| JP | 2001168333 A | 6/2001 | |
| JP | 2001308327 A | 11/2001 | |
| JP | 2009021557 A | 1/2009 | |
| JP | 2009152465 A | 7/2009 | |
| JP | 2013021104 A | 1/2013 | |
| JP | 2013080796 A | 5/2013 | |
| JP | 2013090796 A | 5/2013 | |
| JP | 2014132625 A | 7/2014 | |
| JP | 2015179705 A | 10/2015 | |
| JP | 2016174029 A | 9/2016 | |
| JP | 2016197678 A | 11/2016 | |
| JP | 2016219774 A | 12/2016 | |
| JP | 2017041601 A | 2/2017 | |
| JP | 2017098359 A | 6/2017 | |
| JP | 2017147435 A | 8/2017 | |
| WO | 2009096412 A1 | 8/2009 | |
| WO | 2013046377 A1 | 4/2013 | |
| WO | 2014188570 A1 | 11/2014 | |
| WO | 2015068203 A1 | 5/2015 | |
| WO | 2015162811 A1 | 10/2015 | |
| WO | 2016080269 A1 | 5/2016 | |
| WO | 2017006711 A1 | 1/2017 | |
| WO | 2017047276 A1 | 3/2017 | |
| WO | WO-2017141998 A1 * | 8/2017 | ......... H01L 21/2652 |
| WO | 2017155122 A1 | 9/2017 | |

OTHER PUBLICATIONS

Office Action issued for counterpart Japanese Application No. 2023-021098, transmitted from the Japanese Patent Office on Mar. 26, 2024 (drafted on Mar. 19, 2024).

International Search Report and (ISA/237) Written Opinion of the International Search Authority for International Patent Application No. PCT/JP2018/037481, mailed by the Japan Patent Office on Jan. 8, 2019.

Office Action issued for counterpart Japanese Application No. 2019-558931, issued by the Japanese Patent Office on Jul. 6, 2021 (drafted on Jul. 2, 2021).

Office Action issued for counterpart Japanese Application No. 2021-142776, issued by the Japan Patent Office on Aug. 2, 2022 (drafted on Jul. 22, 2022).

Office Action issued for counterpart Chinese Application 201880036426. 9, issued by The State Intellectual Property Office of People's Republic of China on Dec. 2, 2022.

Those references were submitted as IDS over the earlier U.S. Appl. No. 16/693,367, filed Nov. 24, 2019.

Those references were submitted as IDS over the earlier U.S. Appl. No. 17/577,048, filed Jan. 17, 2022.

Office Action issued for counterpart Japanese Application No. 2024-156697, transmitted from the Japanese Patent Office on Jun. 3, 2025 (drafted on May 26, 2025).

* cited by examiner

SEMICONDUCTOR DEVICE

CROSS-REFERENCE TO RELATED APPLICATIONS

This application is a continuation application of U.S. patent application Ser. No. 17/577,048, filed on Jan. 17, 2022, which is a divisional of U.S. patent application Ser. No. 16/693,367, filed on Nov. 24, 2019, which is a continuation of International Application No. PCT/JP2018/037481 filed on Oct. 5, 2018, which claims priority to Japanese Patent Application No. 2017-239713 filed in JP on Dec. 14, 2017, the contents of each of which are hereby incorporated herein by reference in their entirety.

BACKGROUND

1. Technical Field

The present invention relates to a semiconductor device.

2. Related Art

In the related art, a semiconductor device including a transistor section and a diode section is known (for example, refer to Patent Document 1). A semiconductor device including a current sense section is also known (for example, refer to Patent Documents 2 and 3).
  Patent Document 1: WO2015/068203
  Patent Document 2: Japanese Patent Application Publication No. 2015-179705
  Patent Document 3: Japanese Patent Application Publication No. H10-107282

In the semiconductor device, it is required to improve element breakdown resistance by reducing an influence of noise or lessening current concentration.

GENERAL DISCLOSURE

A first aspect of the present invention provides a semiconductor device having a transistor section and a diode section. The semiconductor device may include a gate metal layer provided above an upper surface of a semiconductor substrate; an emitter electrode provided above the upper surface of the semiconductor substrate; a first conductivity-type emitter region provided on the upper surface side of the semiconductor substrate in the transistor section; a gate trench section provided on the upper surface side of the semiconductor substrate in the transistor section, electrically connected to the gate metal layer and being in contact with the emitter region; an emitter trench section provided on the upper surface side of the semiconductor substrate in the diode section and electrically connected to the emitter electrode; and a dummy trench section provided on the upper surface side of the semiconductor substrate, electrically connected to the gate metal layer and being not in non-contact with the emitter region.

The semiconductor device may further include a boundary region formed in a region in which the transistor section and the diode section are adjacent to each other, and provided so as to prevent interference between the transistor section and the diode section. The dummy trench section may be arranged in the boundary region.

The dummy trench section may be provided also in a non-boundary region of the transistor section or the diode section.

The semiconductor device may further include a boundary region formed in a region in which the transistor section and the diode section are adjacent to each other, and provided so as to prevent interference between the transistor section and the diode section. The dummy trench section may be provided in a non-boundary region of the transistor section or the diode section.

The transistor section may have an edge neighboring region adjacent to an edge termination region. The dummy trench section may be provided in the edge neighboring region.

When a number of the gate trench section is denoted as G and a number of the dummy trench section is denoted as D, a relationship of $0.01 < D/(D+G) < 0.2$ may be satisfied.

The gate trench section, the emitter trench section and the dummy trench section may be aligned in a preset alignment direction. A width of the diode section in the alignment direction may be greater than a width of the transistor section in the alignment direction.

The semiconductor device may further include an upper surface lifetime killer introduced into a non-boundary region of at least the diode section on the upper surface side of the semiconductor substrate, and a first conductivity-type cathode region in the diode section on a lower surface side of the semiconductor substrate. The cathode region may further extend toward the transistor section than the upper surface lifetime killer.

The semiconductor device may further include a first conductivity-type accumulation region, which has a higher concentration than the emitter region, on the upper surface side of the semiconductor substrate in the transistor section. The accumulation region may not be provided in a mesa section adjacent to the dummy trench section.

The semiconductor device may further include a first conductivity-type drift region provided in the semiconductor substrate. A mesa section adjacent to the dummy trench section may include a second conductivity-type contact region provided on the upper surface side of the semiconductor substrate, and a second conductivity type base region provided between the drift region and the contact region. The contact region may have a doping concentration higher than the base region.

A film thickness of a dummy insulating film of the dummy trench section may be smaller than a gate insulating film of the gate trench section and an emitter insulating film of the emitter trench section.

A trench depth of the dummy trench section may be greater than a trench depth of the gate trench section and a trench depth of the emitter trench section.

The semiconductor device may include a current sense section. Each of the gate trench section, the emitter trench section and the dummy trench section may be aligned in a preset alignment direction on the upper surface side of the semiconductor substrate. A gate emitter ratio obtained by dividing a number of the gate trench section included in a unit length in the alignment direction by a number of the emitter trench section may be greater in the current sense section than in the transistor section.

A second aspect of the present invention provides a semiconductor device having a transistor section and a current sense section. The semiconductor device may include a gate wire section provided above an upper surface of a semiconductor substrate. The semiconductor device may include an emitter electrode provided above the upper surface of the semiconductor substrate. The semiconductor device may include a plurality of trench sections aligned in a preset alignment direction on the upper surface side of the semiconductor substrate. The trench sections may include a gate trench section electrically connected to the gate wire section. The trench sections may have an emitter trench section electrically connected to the emitter electrode. A gate emitter ratio obtained by dividing a number of the gate trench section included in a unit length in the alignment direction by a number of the emitter trench section may be greater in the current sense section than in the transistor section.

In the transistor section, both the gate trench section and the emitter trench section may be arranged. In the current sense section, the gate trench section may be arranged and the emitter trench section may not be arranged.

The semiconductor device may include a first conductivity-type drift region provided in the semiconductor substrate. The semiconductor device may include a first conductivity-type emitter region provided on the upper surface side of the semiconductor substrate and having a doping concentration higher than the drift region. The semiconductor device may include a first conductivity-type accumulation region provided below the emitter region in the semiconductor substrate and having a doping concentration higher than the drift region. In a plane parallel to the upper surface of the semiconductor substrate, an area ratio obtained by dividing an area of the accumulation region included in the current sense section by an area of the emitter region may be smaller than an area ratio obtained by dividing an area of the accumulation region included in the transistor section by an area of the emitter region.

The transistor section may be provided with both the emitter region and the accumulation region. The current sense section may be provided with the emitter region and may not be provided with the accumulation region.

The gate wire section may have an opening portion formed to penetrate the gate wire section from an upper surface to a lower surface. At least a part of the current sense section may be arranged in a region overlapping the opening portion.

The gate wire section may include a gate metal layer formed of metal, and a gate runner formed of semiconductor having impurities added thereto. The opening portion may be provided in the gate runner.

The semiconductor device may include a first well region provided to surround the transistor section in a plane parallel to the upper surface of the semiconductor substrate and formed to be deeper than a range from the upper surface of the semiconductor substrate to a lower end of the trench section. The semiconductor device may include a second well region provided to surround the current sense section in the plane parallel to the upper surface of the semiconductor substrate and formed to be deeper than the range from the upper surface of the semiconductor substrate to the lower end of the trench section. A shortest distance between the emitter region and the second well region provided in the current sense section in the alignment direction may be greater than a shortest distance between the emitter region and the first well region provided in the transistor section in the alignment direction.

A shortest distance between the emitter region and the second well region provided in the current sense section in a direction perpendicular to the alignment direction may be greater than a shortest distance between the emitter region and the first well region provided in the transistor section in the direction perpendicular to the alignment direction.

In the meantime, the summary of the present invention does not necessarily describe all necessary features of the present invention. The present invention may also be a sub-combination of the features described above.

DESCRIPTION OF EXEMPLARY EMBODIMENTS

Hereinbelow, embodiments of the present invention will be described. The embodiments do not limit the invention according to the claims. Also, all combinations of features described in the embodiments are not necessarily essential to solving means of the invention.

As used herein, one side in a direction parallel to a depth direction of a semiconductor substrate is referred to as "upper," and the other side is referred to as "lower." One surface of two principal surfaces of a substrate, a layer or another member is referred to as upper surface, and the other surface is referred to as lower surface. The "upper", "lower", "surface" and "backside" directions are not limited to a gravity direction, or a mounting direction of a semiconductor device to a substrate and the like.

As used herein, a technical matter may be described using orthogonal coordinate axes of X-axis, Y-axis and Z-axis. As used herein, a plane parallel to an upper surface of the semiconductor substrate is referred to as an XY plane, and a depth direction of the semiconductor substrate is defined as the Z-axis. In the meantime, a case in which the semiconductor substrate is seen from the Z-axis direction is referred to as "as seen from above", as used herein.

In each embodiment, an example is shown in which a first conductivity type is N type, and a second conductivity type is P type; however, the first conductivity type may be P type, and the second conductivity type may be N type. In this case, the conductivity types of the substrate, layers, regions, and the like in each embodiment are reversed.

As used herein, layers and regions each having "n" or "p" attached at the head thereof mean that majority carriers of each of the layers and regions are electrons or holes. "+" and "−" attached to "n" and "p" mean that doping concentrations are respectively higher and lower than the layers and regions without "+" and "−".

Figure 1A:
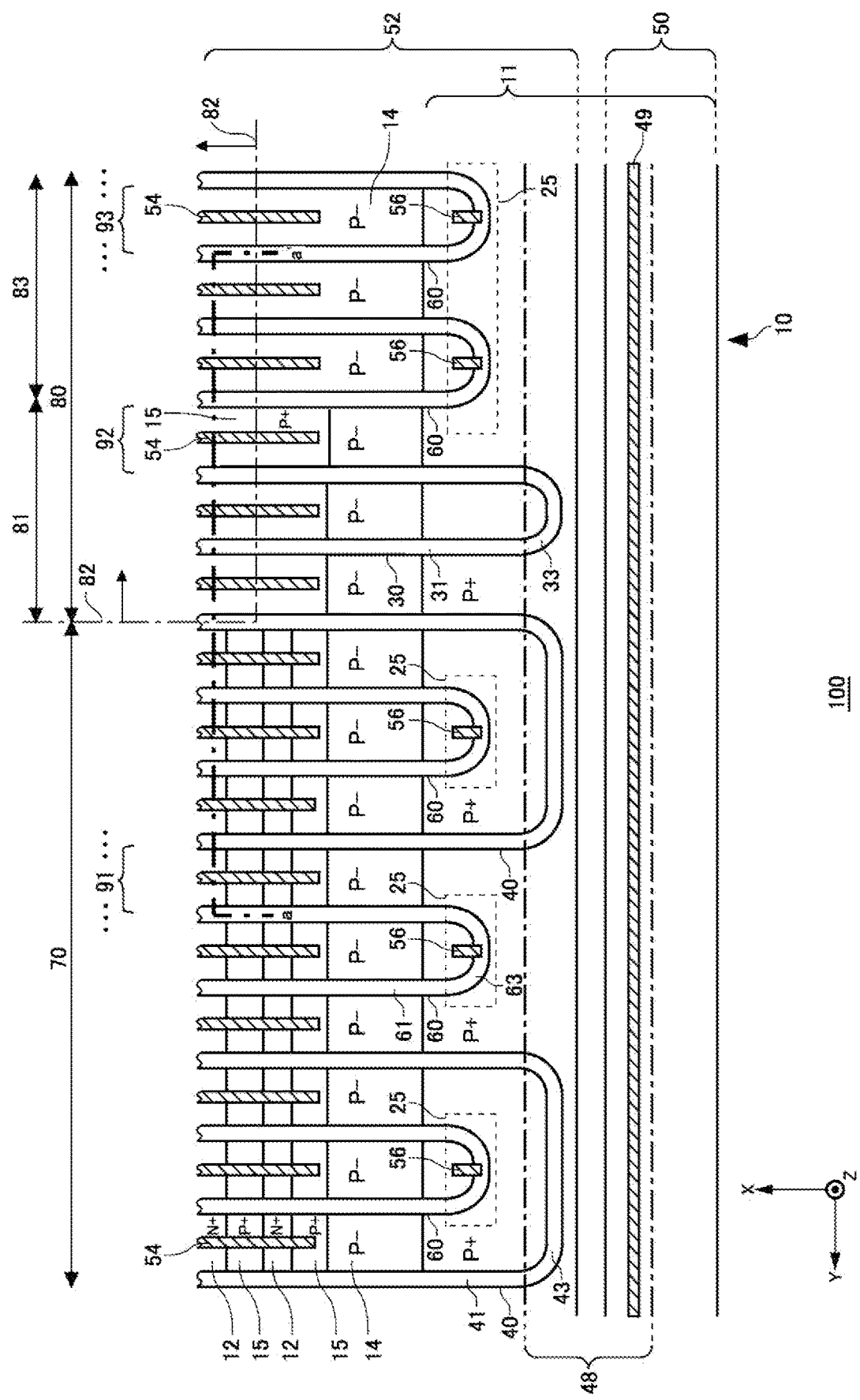
FIG. 1A is an example of a top view showing a semiconductor device 100 according to a first embodiment.

FIG. 1A shows an example of a configuration of a semiconductor device 100 according to a first embodiment. The semiconductor device 100 of the present example is a semiconductor chip having a transistor section 70 and a diode section 80. For example, the semiconductor device 100 is a reverse conducting IGBT (RC-IGBT).

The transistor section 70 is a region including emitter regions 12 and gate trench sections 40. The transistor section 70 of the present example is a region in which a collector region provided on a lower surface side of a semiconductor substrate 10 is projected to an upper surface of the semiconductor substrate 10 but is not limited thereto. The collector region has a second conductivity-type. The collector region of the present example is P+ type, as an example. The transistor section 70 includes transistors such as IGBT.

The diode section 80 includes diodes such as a free wheel diode (FWD) provided in the vicinity of the transistor section 70 on the upper surface of the semiconductor substrate 10. The diode section 80 of the present example is a region in which a cathode region 82 is projected to the upper surface of the semiconductor substrate 10, and is a region except the transistor section 70 but is not limited thereto.

In FIG. 1A, a region around a chip end portion, which is an edge side of the semiconductor device 100, is shown and the other regions are not shown. In the meantime, in the present example, for convenience sake, an edge on a negative side in the X-axis direction is described. However, the other edges of the semiconductor device 100 are also similar.

The semiconductor substrate 10 may be a silicon substrate, a silicon carbide substrate, a nitride semiconductor substrate such as a gallium nitride substrate, or the like. The semiconductor substrate 10 of the present example is a silicon substrate.

The semiconductor device 100 of the present example includes gate trench sections 40, dummy trench sections 30, emitter trench sections 60, a well region 11, emitter regions 12, base regions 14 and contact regions 15 on the upper surface side of the semiconductor substrate 10. Also, the semiconductor device 100 of the present example includes an emitter electrode 52 and a gate metal layer 50 provided above the upper surface of the semiconductor substrate 10.

The emitter electrode 52 and the gate metal layer 50 are formed of materials including metal. For example, at least a partial region of the emitter electrode 52 may be formed of aluminum, aluminum-silicon alloy or aluminum-silicon-copper alloy. At least a partial region of the gate metal layer 50 may be formed of aluminum, aluminum-silicon alloy or aluminum-silicon-copper alloy. The emitter electrode 52 and the gate metal layer 50 may have barrier metal formed of titanium or a titanium compound in a layer underlying the region formed of aluminum or the like. The emitter electrode 52 and the gate metal layer 50 are provided isolated from each other.

The emitter electrode 52 and the gate metal layer 50 are provided above the semiconductor substrate 10, with an interlayer dielectric film being interposed therebetween. In FIG. 1A, the interlayer dielectric film is omitted. The interlayer dielectric film is provided with a contact hole 49, contact holes 54 and contact holes 56 to penetrate therethrough.

The contact hole 49 is formed to interconnect the gate metal layer 50 and a gate runner 48. In the contact hole 49, a plug formed of tungsten or the like may be formed.

The gate runner 48 is formed to interconnect the gate metal layer 50 and the gate trench section 40 of the transistor section 70. As an example, the gate runner 48 is connected to a gate conductive section in the gate trench section 40 and a dummy conductive section in the dummy trench section 30 on the upper surface side of the semiconductor substrate 10. The gate runner 48 is not connected to an emitter conductive section in the emitter trench section 60. For example, the gate runner 48 is formed of polysilicon doped with impurities. The gate metal layer 50 and the gate runner 48 are examples of the gate wire section.

The gate runner 48 of the present example is provided from below the contact hole 49 to a tip end portion of the gate trench section 40. An interlayer dielectric film such as an oxide film is provided between the gate runner 48 and the upper surface of the semiconductor substrate 10. At the tip end portion of the gate trench section 40, the gate conductive section is exposed to the upper surface of the semiconductor substrate 10. The gate trench section 40 is in contact with the gate runner 48 on the exposed part of the gate conductive section.

The contact hole 56 is formed to interconnect the emitter electrode 52 and the emitter conductive section in the emitter trench section 60. In the contact hole 56, a plug formed of tungsten or the like may be provided.

A connection section 25 is provided between the emitter electrode 52 and the emitter conductive section. The connection section 25 is formed of a conductive material such as polysilicon doped with impurities. The connection section 25 is provided above the upper surface of the semiconductor substrate 10 with an interlayer dielectric film such as an oxide film being interposed.

The gate trench sections 40 are aligned at predetermined intervals in a preset alignment direction (Y-axis direction, in the present example). The gate trench section of the present example may have two extension parts 41 extending in an extension direction (X-axis direction, in the present example) parallel to the upper surface of the semiconductor substrate 10 and perpendicular to the alignment direction and a connection part 43 connecting the two extension parts 41. The gate trench section 40 of the present example is electrically connected to the gate metal layer 50. Also, the gate trench section 40 is in contact with the emitter region 12.

At least a portion of the connection part 43 is preferably formed in a curved shape. End portions of the two extension parts 41 of the gate trench section 40 are connected to lessen electric field concentration at the end portions of the extension parts 41. The gate runner 48 may be connected to the gate conductive section at the connection part 43 of the gate trench section 40.

The dummy trench sections 30 are aligned at predetermined intervals in a preset alignment direction (Y-axis direction, in the present example), like the gate trench sections 40. The dummy trench section 30 of the present example may have a U-shape on the upper surface side of the semiconductor substrate 10, like the gate trench section 40. That is, the dummy trench section 30 may have two extension parts 31 extending in an extension direction and a connection part 33 connecting the two extension parts 31. The dummy trench section 30 is electrically connected to the gate metal layer 50. However, the dummy trench section 30 is different from the gate trench section 40, in that it is not in contact with the emitter region 12. For example, the semiconductor device 100 can adjust capacitance between the gate and the emitter by adjusting a ratio of the gate trench sections 40 and the dummy trench sections 30.

The emitter trench sections 60 are aligned at predetermined intervals in a preset alignment direction (Y-axis direction, in the present example), like the gate trench sections 40. The emitter trench section 60 of the present example may have a U-shape on the upper surface side of the semiconductor substrate 10, like the gate trench section 40. That is, the emitter trench section 60 may have two extension parts 61 extending in an extension direction and a connection part 63 connecting the two extension parts 61. The emitter trench section 60 is electrically connected to the emitter electrode 52. For example, the emitter trench section 60 is provided in the diode section 80, so that potential around the emitter trench section 60 is difficult to be deflected.

The emitter electrode 52 is provided above the gate trench sections 40, the dummy trench sections 30, the emitter trench sections 60, the well region 11, the emitter regions 12, the base regions 14 and the contact regions 15.

The well region 11 is a second conductivity-type region provided on the upper surface side of the semiconductor substrate 10 with respect to a drift region 18, which will be described later. The well region 11 is, as an example, P+ type. The well region 11 is provided within a preset range from an end portion of an active region of a side on which the gate metal layer 50 is provided. A diffusion depth of the well region 11 may be greater than depths of the gate trench section 40, the dummy trench section and the emitter trench section 60. Partial regions of the gate trench section 40, the dummy trench section 30 and the emitter trench section 60 on the gate metal layer are provided in the well region 11. Bottoms of ends of the gate trench section the dummy trench section 30 and the emitter trench section 60 in the extension direction may be covered by the well region 11.

The contact hole 54 is formed above each of the emitter region 12 and the contact region 15 in the transistor section 70. Also, the contact hole 54 is formed above the base region 14 in the diode section 80. The contact hole 54 is formed above the contact region 15 in the boundary region 81. In this way, the interlayer dielectric film is formed with one or more contact holes 54. One or more contact holes 54 may be formed with extending in the extension direction. In the first embodiment, the contact region 15 is provided on the upper surface of the boundary region 81. However, like the diode section 80, the base region 14 may be provided on the upper surface of the boundary region 81. This is not limited to the first embodiment and applies to second to fifth embodiments to be described later.

The boundary region 81 is provided in a region in which the transistor section and the diode section 80 are adjacent to each other. As used herein, the boundary region 81 is provided in a region, in which the transistor section 70 and the diode section 80 are adjacent to each other, for preventing interference therebetween. Specifically, the boundary region 81 has a device structure, which is different from a device structure (so-called MOS structure) of the transistor section 70 and a device structure of the diode such as a free wheel diode of the diode section 80. Therefore, the boundary region 81 has a device structure, which is different from a device structure of the transistor section 70 and a device structure of the diode section 80, and may be set as a region positioned between a device structure in which a channel of the transistor section 70 is formed and a device structure of the diode of the diode section 80 in the alignment direction of the trench sections.

The device structure of the boundary region 81, which is different from a device structure of the transistor section 70 and a device structure of the diode section 80, refers to, for example, a region having a device structure, which is different from the transistor section 70 and the diode section 80 with respect to at least one of the emitter region 12, the contact region 15, the accumulation region 16, the trench section, the depth of the trench section, and a lifetime killer, a buffer region 20, a cathode region 82 and a collector region 22, which will be described later. As the difference in the structure of the trench section, a deviation from any periodic structure (repetitive structure) of the trench section of the transistor section 70 and the trench section of the diode section 80 may be exemplified. Like the example, the device structure, which is different from a device structure of the transistor section 70 and a device structure of the diode section 80, is not focused on only a single range (for example, between the single trench) of the transistor section 70 or the diode section 80, and may be a region different from a pattern of the periodic structure (repetitive structure) of the transistor section 70 or the diode section 80 even if it is focused on the periodic structure.

Also, the boundary region 81 may be within a range from 10 μm to 100 μm or from 50 μm to 100 μm. A base point of the length of the boundary region 81 may be, for example, the gate trench section 40 in which a channel of the transistor section 70 is formed, and a region from the gate trench section 40 to a point of 10 μm to 100 μm toward the diode section 80 may be set as the boundary region 81.

A thickness of the semiconductor substrate 10 may be determined, depending on a withstand voltage of the semiconductor device 100, and a width of the boundary region 81 in the Y-axis direction may be determined, depending on the thickness of the semiconductor substrate 10. Specifically, a configuration may be made so that the higher the withstand voltage of the semiconductor device 100 is, the greater the width of the boundary region 81 in the Y-axis direction is. Also, the width of the boundary region 81 in the Y-axis direction may be determined, depending on a flow aspect and an amount of carriers in the semiconductor substrate 10. Specifically, a configuration may be made so that the more the amount of carriers to flow per unit time between the transistor section 70 and the diode section 80 is, the greater the width of the boundary region 81 in the Y-axis direction is. Also, a configuration may be made so that the more the amount of carriers in the semiconductor substrate 10 is, the greater the width of the boundary region 81 in the Y-axis direction is.

The boundary region 81 may have a plurality of mesa sections. More preferably, the boundary region 81 may have four to ten mesa sections. A base point of the mesa section of the boundary region 81 may be, for example, the gate trench section 40 in which a channel of the transistor section 70 is formed, and four to ten mesa sections from the gate trench section 40 toward the diode section 80 may be set as the boundary region 81. A width of one mesa section in the Y-axis direction may be about 10 μm. A length of the four mesa sections with the three trench sections being interposed therebetween in the Y-axis direction may be 50 μm, or a length of the five mesa sections with the four trench sections being interposed therebetween in the Y-axis direction may be 50 μm. Also, a length of the eight mesa sections with the seven trench sections being interposed therebetween in the Y-axis direction may be 100 μm or a length of the ten mesa sections with the nine trench sections being interposed therebetween in the Y-axis direction may be 100 μm.

The boundary region 81 having a structure, which is different from a non-boundary region 83 of the transistor section 70 or the diode section 80, is provided, so that it is possible to reduce interference of current between the boundary region and the transistor section 70 or the diode section 80. As an example, as the width of the boundary region 81 in the Y-axis direction increases, it is possible to reduce the interference of current more effectively.

In the first embodiment, the boundary region 81 is provided in the diode section 80. Also, in the first embodiment, the boundary region 81 is a region with no emitter region 12 between the gate trench section 40 and the emitter trench section 60. Since the boundary region 81 has no emitter region 12, the semiconductor device 100 is difficult to latch up. The boundary region 81 refers to a region between a region, in which the gate trench sections 40 of the transistor section 70 are arranged at predetermined pitches in the Y-axis direction, and a region, in which the emitter trench sections 60 of the diode section 80 are arranged at predetermined pitches in the Y-axis direction.

The non-boundary region 83 is a region except the boundary region 81 in the transistor section 70 or the diode section 80. In the first embodiment, since the boundary region 81 is provided in the diode section 80, a region except the boundary region 81 of the diode section 80 is referred to as the non-boundary region 83. In the first embodiment, the non-boundary region 83 is a region having the emitter trench sections 60 in a region different from the boundary region 81. Thus, the non-boundary region 83 includes a region, in which the emitter trench sections 60 are arranged at predetermined pitches, of the region in which the cathode region 82 is projected to the upper surface of the semiconductor substrate 10. In this case, since the transistor section 70 is not provided with the boundary region 81, the transistor section 70 is entirely a non-boundary region.

The dummy trench section 30 is provided in the boundary region 81. However, the dummy trench section 30 may be provided also in the non-boundary region 83. The dummy trench section 30 may be provided in only the non-boundary region 83. Also, the boundary region 81 may be provided with the gate trench section or the emitter trench section 60. In the meantime, a half or more or all of the trench sections positioned within the range of the boundary region 81 may be the dummy trench sections 30.

A first mesa section 91, a second mesa section 92 and a third mesa section 93 are mesa sections provided in the vicinity of each of the trench sections in the Y-axis direction, in a plane parallel to the upper surface of the semiconductor substrate 10. The mesa section is a part of the semiconductor substrate 10 positioned between the two trench sections adjacent to each other, and may be a part ranging from the upper surface of the semiconductor substrate 10 to the deepest bottom of each of the trench sections. An extension part of each of the trench sections may be configured as one trench section. That is, a region positioned between the two extension parts may be configured as the mesa section.

The first mesa section 91 is provided in the vicinity of at least one of the gate trench section 40 and the emitter trench section 60 in the transistor section 70. Also, the first mesa section 91 of the present example is provided in the boundary region 81, also in the vicinity of the transistor section 70. The first mesa section 91 has the well region 11, the emitter region 12, the base region 14 and the contact region 15 on the upper surface side of the semiconductor substrate 10. In the first mesa section 91, the emitter region 12 and the contact region 15 are alternately provided in the extension direction.

The second mesa section 92 is a mesa section provided in the boundary region 81. The second mesa section 92 has the well region 11, the base region 14 and the contact region 15 on the upper surface side of the semiconductor substrate 10. In the first embodiment, the second mesa section 92 has no emitter region 12 but may have the emitter region 12. Also, in the first embodiment, the second mesa section 92 has the contact region 15 but may not have the contact region 15.

The third mesa section 93 is provided in a region positioned between the emitter trench sections 60 adjacent to each other in the diode section 80. The third mesa section 93 has the well region 11 and the base region 14 on the upper surface side of the semiconductor substrate 10.

Figure 1B:
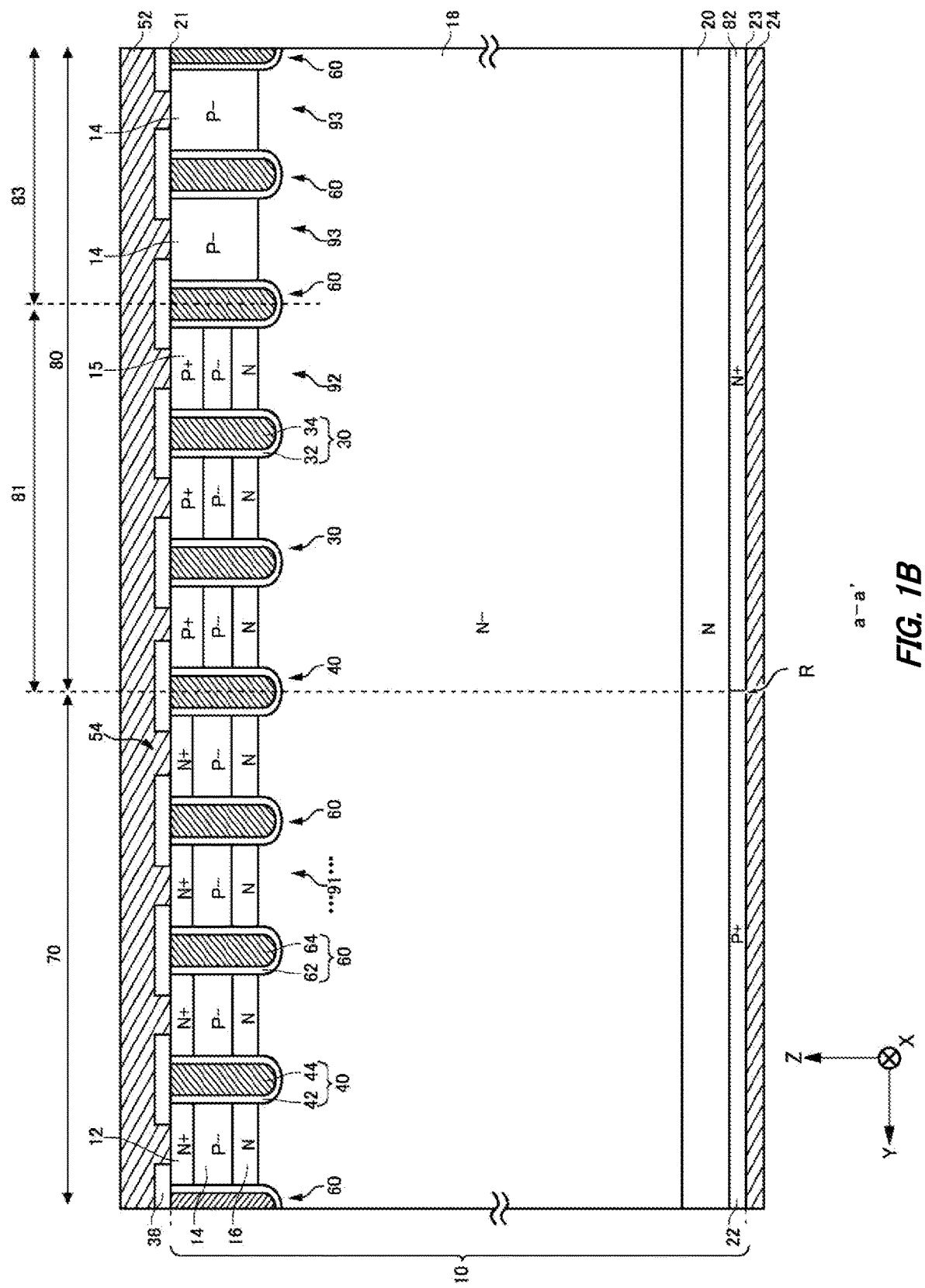
FIG. 1B is an example of a cross-sectional view taken along a line a-a' of the semiconductor device 100 according to the first embodiment.

The base region 14 is a second conductivity-type region provided on the upper surface side of the semiconductor substrate 10. The base region 14 is, as an example, P− type. The base region 14 may be provided at both end portions of the first mesa section 91 and the second mesa section 92 in the X-axis direction on the upper surface side of the semiconductor substrate 10. However, as shown in FIG. 1B, the base region 14 is provided over a substantially entire surface of the active region in the sectional view. In the meantime, FIG. 1A shows only one end portion of the base region 14 in the X-axis direction.

The emitter region 12 is provided in contact with the gate trench section 40 on an upper surface side of the first mesa section 91. The emitter region 12 may be provided in the Y-axis direction from one trench section of two trench sections, which extend in the X-axis direction with the first mesa section 91 being interposed therebetween, to the other trench section. The emitter region 12 is provided also below the contact hole 54. The emitter region 12 of the present example is a first conductivity-type. The emitter region 12 is, as an example, N+ type.

The contact region 15 is a second conductivity-type region having a doping concentration higher than the base region 14. The contact region 15 of the present example is, as an example, P+ type. The contact region 15 of the present example is provided on the upper surface side of the first mesa section 91. The contact region 15 may be provided in the Y-axis direction from one trench section of two trench sections, which extend in the X-axis direction with the first mesa section 91 being interposed therebetween, to the other trench section. The contact region 15 may be in contact with the gate trench section 40 or not. Also, the contact region 15 may be in contact with the emitter trench section 60 or not. The contact region 15 of the present example is in contact with the dummy trench section 30 and the gate trench section 40. The contact region 15 is provided also below the contact hole 54.

The contact region 15 may be provided also on an upper surface side of the second mesa section 92. An area of the contact region 15 provided on the upper surface side of one second mesa section 92 is greater than an area of the contact region provided on the upper surface side of one first mesa section 91. The contact region provided on the upper surface side of one second mesa section 92 may be provided over an entire region positioned between the base regions 14 provided at both end portions of the second mesa section 92 in the X-axis direction.

The cathode region 82 is a first conductivity-type region provided on the lower surface side of the semiconductor substrate 10, in the diode section 80. The cathode region 82 of the present example is, as an example, N+ type. A region in which the cathode region 82 is provided is shown with the dashed-dotted line, as seen from above.

FIG. 1B is an example of a cross-sectional view taken along a line a-a' in FIG. 1A. The cross-section a-a' is a YZ plane passing the emitter region 12, the base region 14 and the contact region 15, in the transistor section 70 and the diode section 80. In the cross-section a-a', the semiconductor device 100 of the present example includes the semiconductor substrate 10, an interlayer dielectric film 38, the emitter electrode 52 and an collector electrode 24. The emitter electrode 52 is provided on the upper surface of the semiconductor substrate 10 21 and an upper surface of the interlayer dielectric film 38.

The drift region 18 is a first conductivity-type region provided in the semiconductor substrate 10. The drift region 18 of the present example is, as an example, N− type. The drift region 18 may be a remaining region, in which the other doping regions are not formed, of the semiconductor substrate 10. That is, a doping concentration of the drift region 18 may be a doping concentration of the semiconductor substrate 10.

The buffer region 20 is a first conductivity-type region provided below the drift region 18. The buffer region 20 of the present example is, as an example, N type. A doping concentration of the buffer region 20 is higher than the doping concentration of the drift region 18. The buffer region 20 may serve as a field stop layer configured to prevent a depletion layer, which expands from the lower surface side of the base region 14, from reaching the second conductivity-type collector region 22 and the first conductivity-type cathode region 82.

The collector region 22 is a second conductivity-type region provided on the lower surface side of the semiconductor substrate 10, in the transistor section 70. The collector region 22 is, as an example, P+ type. The collector region 22 of the present example is provided below the buffer region 20.

The cathode region 82 is provided below the buffer region 20 in the diode section 80. A boundary R is a boundary between the collector region 22 and the cathode region 82. The boundary R may coincide with or may be different from a boundary between the transistor section 70 and the diode section 80.

The collector electrode 24 is formed on a lower surface 23 of the semiconductor substrate 10. The collector electrode 24 is formed of a conductive material such as metal.

The accumulation region 16 is a first conductivity-type region provided above the drift region 18 in the first mesa section 91 and the second mesa section 92. The accumulation region 16 of the present example is, as an example, N type. The accumulation region 16 is provided in contact with the gate trench section 40. The accumulation region 16 may be in contact with the dummy trench section 30 or not. A doping concentration of the accumulation region 16 is higher than the doping concentration of the drift region 18. The accumulation region 16 is provided, so that it is possible to increase a carrier injection enhancement effect (IE effect), thereby reducing an on-voltage of the transistor section 70. In the meantime, the accumulation region 16 may be provided in the third mesa section 93.

The base region 14 is a second conductivity-type region provided above the accumulation region 16, in the first mesa section 91, the second mesa section 92 and the third mesa section 93. The base region 14 is provided in contact with the gate trench section 40. The base region 14 in the third mesa section 93 is a so-called anode region.

The emitter region 12 is provided between the base region 14 and an upper surface 21, in the first mesa section 91. The emitter region 12 is provided in contact with the gate trench section 40. A doping concentration of the emitter region 12 is higher than the doping concentration of the drift region 18. An example of dopant of the emitter region 12 is arsenic (As). In the meantime, the emitter region 12 may be or may not be provided in the second mesa section 92.

The contact region 15 is provided above the accumulation region 16, in the first mesa section 91 and the second mesa section 92. The contact region 15 is provided in contact with the gate trench section 40 and the dummy trench section 30, in the first mesa section 91 and the second mesa section 92.

One or more gate trench sections 40 and one or more dummy trench sections 30 are provided on the upper surface 21-side. Each of the trench sections is provided from the upper surface 21 to the drift region 18. In the region in which at least one of the emitter region 12, the base region 14, the contact region 15 and the accumulation region 16 is provided, each of the trench sections reaches the drift region 18 through the regions. The configuration "the trench section passes through the doping region" is not limited to a configuration in which the doping region is formed and then the trench section is formed. A configuration in which the trench sections are formed and then the doping region is formed between the trench sections is also included in the configuration "the trench section passes through the doping region".

The gate trench section 40 has a gate trench, a gate insulating film 42 and a gate conductive section 44 formed on the upper surface 21-side. The gate insulating film 42 is formed to cover an inner wall of the gate trench. The gate insulating film 42 may be formed by oxidizing or nitriding semiconductor of the inner wall of the gate trench. The gate conductive section 44 is formed on a more inner side than the gate insulating film 42 inside the gate trench. The gate insulating film 42 insulates the gate conductive section 44 and the semiconductor substrate 10 from each other. The gate conductive section 44 is formed of a conductive material such as polysilicon. The gate trench section 40 is covered by the interlayer dielectric film 38 on the upper surface 21-side.

The gate conductive section 44 includes a region, which faces the base region 14 adjacent on the first mesa section 91-side with the gate insulating film 42 being interposed therebetween, in a depth direction of the semiconductor substrate 10. When a preset voltage is applied to the gate conductive section 44, a channel, which is an inversion layer of electrons, is formed in a superficial layer of an interface, which is in contact with the gate trench, of the base region 14.

The dummy trench section 30 may have the same structure as the gate trench section 40. The dummy trench section 30 has a dummy trench, a dummy insulating film 32 and a dummy conductive section 34 formed on the upper surface 21-side. The dummy insulating film 32 is formed to cover an inner wall of the dummy trench. The dummy conductive section 34 is formed on a more inner side than the dummy insulating film 32 inside the dummy trench. The dummy insulating film 32 insulates the dummy conductive section 34 and the semiconductor substrate 10 from each other. The dummy trench section 30 is covered by the interlayer dielectric film 38 on the upper surface 21-side.

The emitter trench section 60 may have the same structure as the gate trench section 40 and the dummy trench section 30. The emitter trench section 60 has an emitter trench, an emitter insulating film 62 and an emitter conductive section 64 formed on the upper surface 21-side. The emitter insulating film 62 is formed to cover an inner wall of the emitter trench. The emitter conductive section 64 is formed on a more inner side than the emitter insulating film 62 inside the emitter trench. The emitter insulating film 62 insulates the emitter conductive section 64 and the semiconductor substrate 10 from each other. The emitter trench section 60 is covered by the interlayer dielectric film 38 on the upper surface 21-side.

The interlayer dielectric film 38 is provided above the upper surface of the semiconductor substrate 10. The interlayer dielectric film 38 has one or more contact holes 54 for electrically interconnecting the emitter electrode 52 and the semiconductor substrate 10. Another contact hole 49 and contact hole 54 may also be formed to penetrate the interlayer dielectric film 38. The emitter electrode 52 is provided above the interlayer dielectric film 38.

The semiconductor device 100 of the present example is configured to adjust the capacitance between the gate and the emitter by adjusting a ratio of the gate trench sections 40 and the dummy trench sections 30. The semiconductor device 100 can increase the capacitance between the gate and the emitter by increasing a ratio of the dummy trench sections 30, and decrease the capacitance between the gate and the emitter by decreasing the ratio of the dummy trench sections 30. For example, when a number of the gate trench sections 40 is denoted as G and a number of the dummy trench sections 30 is denoted as D, a relationship of $0.01<D/(D+G)<0.2$ is satisfied.

In the meantime, the number of the gate trench sections 40 refers to a number of the extension parts 41. That is, even in a case in which the plurality of extension parts 41 is connected by the connection part 43 and one gate trench section 40 is thus configured, actually, the number of the plurality of extension parts 41 is the number of the gate trench sections 40. Therefore, the number of the gate trench sections 40 coincides with the number of the gate trench sections 40 in the cross-section a-a', as shown in FIG. 1B.

Also, a number of the dummy trench sections 30 is the same. That is, even in a case in which the plurality of extension parts 31 is connected by the connection part 33 and one dummy trench section 30 is thus configured, actually, the number of the plurality of extension parts 31 is the number of the dummy trench sections 30. Therefore, the number of the dummy trench sections 30 coincides with the number of the dummy trench sections 30 in the cross-section a-a', as shown in FIG. 1B.

Figure 2A:
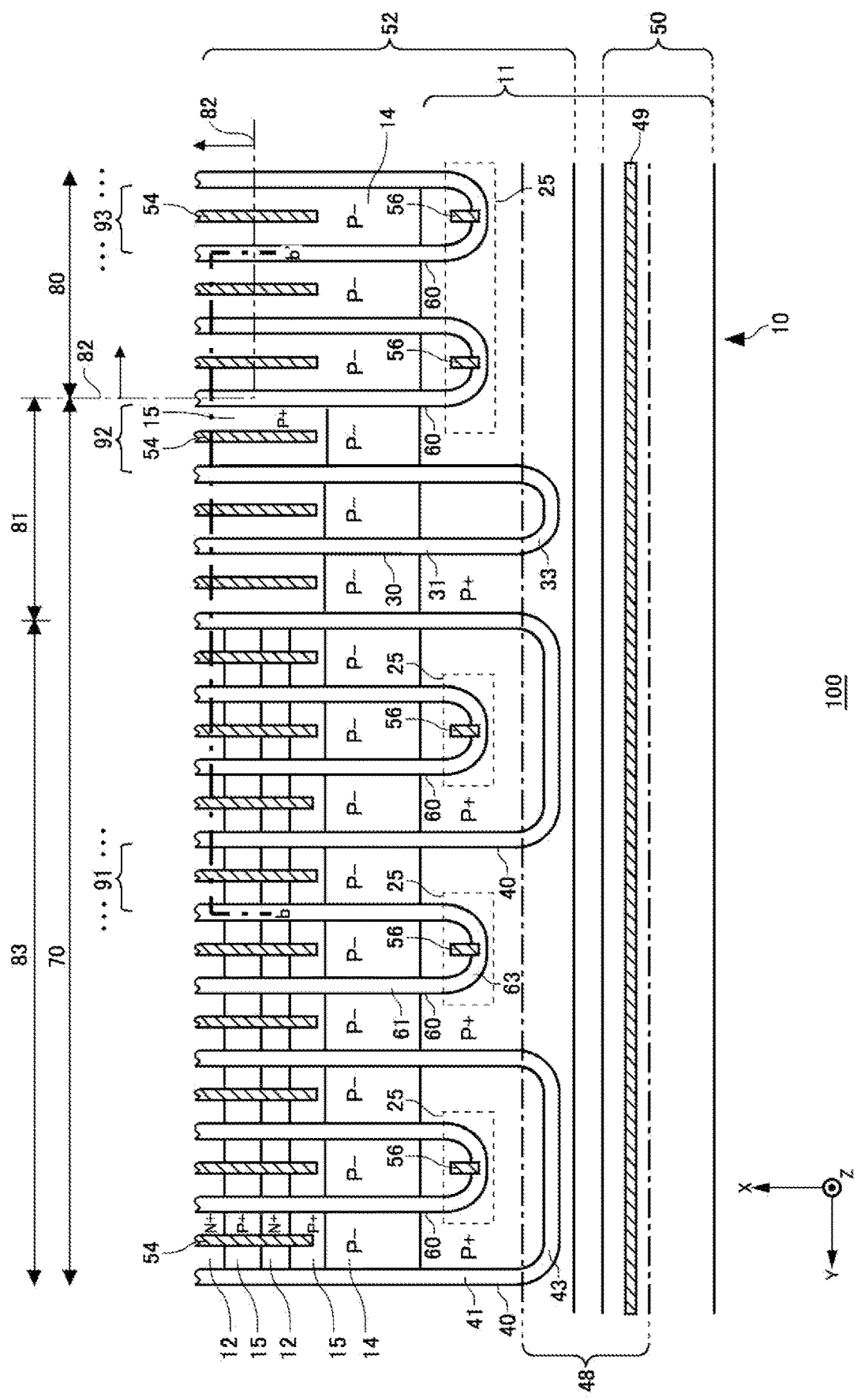
FIG. 2A is an example of a top view showing the semiconductor device 100 according to a second embodiment.
Figure 2B:
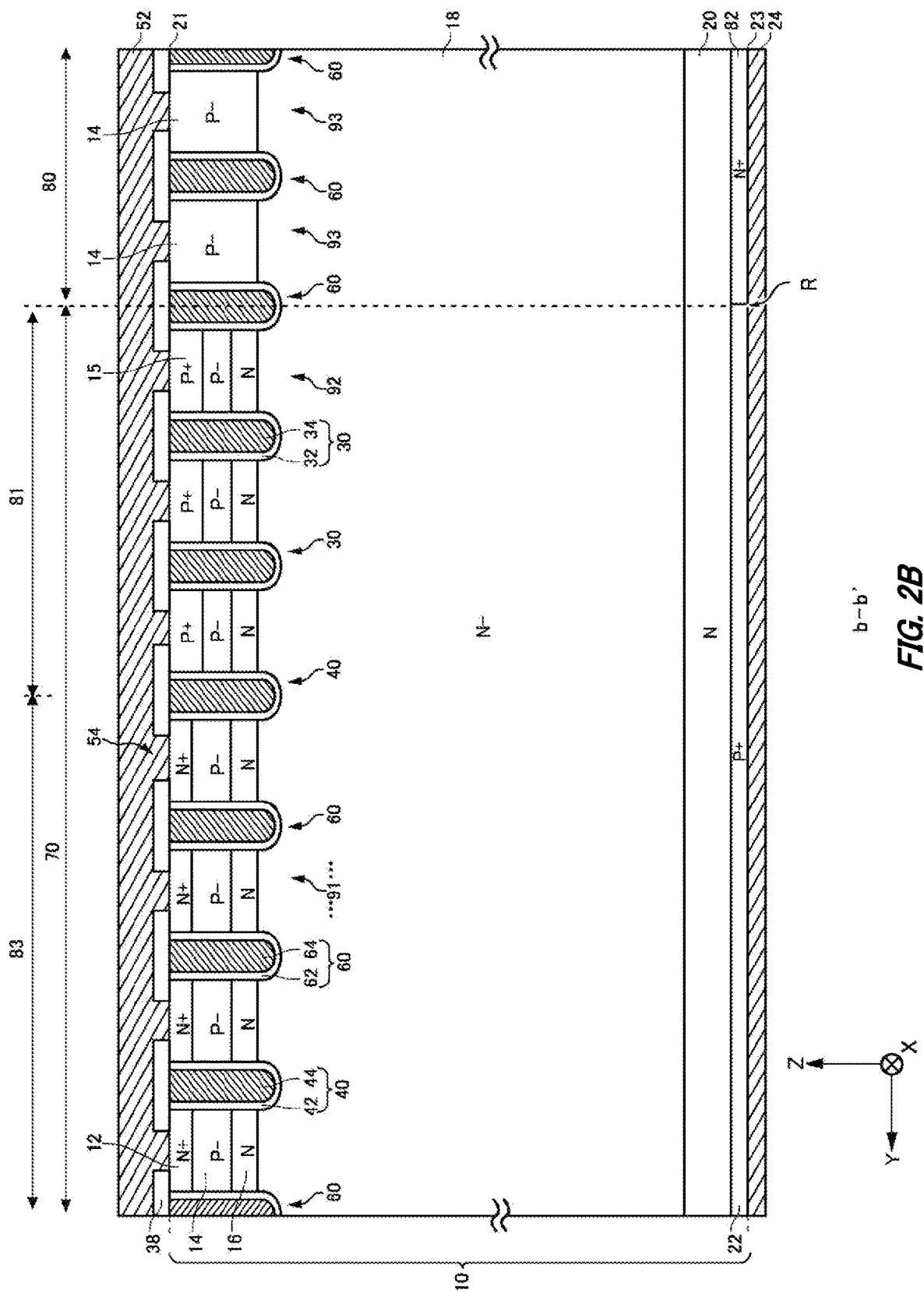
FIG. 2B is an example of a cross-sectional view taken along a line b-b' of the semiconductor device 100 according to the second embodiment.

FIG. 2A is an example of a top view showing the semiconductor device 100 according to a second embodiment. FIG. 2B shows an example of a cross-sectional view taken along a line b-b' in FIG. 2A. The semiconductor device 100 of the second embodiment is different from the semiconductor device 100 according to the first embodiment, in that the boundary region 81 is provided in the transistor section 70. In the semiconductor device 100 of the second embodiment, since the boundary region 81 is provided in the transistor section 70, a region except the boundary region 81 in the transistor section 70 is referred to as a non-boundary region 83. In the meantime, since the diode section 80 is not provided with the boundary region 81, the diode section 80 is entirely a non-boundary region.

In the second embodiment, the non-boundary region 83 is a region different from the boundary region 81 and having the gate trench section 40 and the emitter trench section 60. The non-boundary region 83 includes a region, in which the gate trench sections 40 and the emitter trench sections 60 are arranged at predetermined pitches, of the region in which the collector region 22 is projected to the upper surface of the semiconductor substrate 10.

The dummy trench section 30 is provided in the boundary region 81. However, the dummy trench section 30 may be provided also in the non-boundary region 83. The dummy trench section 30 may be provided in only the non-boundary region 83. Also, the boundary region 81 may be provided with the gate trench section 40 and the emitter trench section 60.

The configuration in which the boundary region 81 is provided in the transistor section 70 means that the cathode region 82 becomes relatively shorter and the collector region 22 becomes relatively longer. For this reason, electrons emitted from the emitter region 12 can be easily introduced into the collector region 22, so that it is possible to lower the on-voltage.

In the meantime, the boundary region 81 may be provided over the transistor section 70 and the diode section 80. In this case, each of the transistor section 70 and the diode section 80 is provided with the non-boundary region 83 except the boundary region 81.

Figure 3:
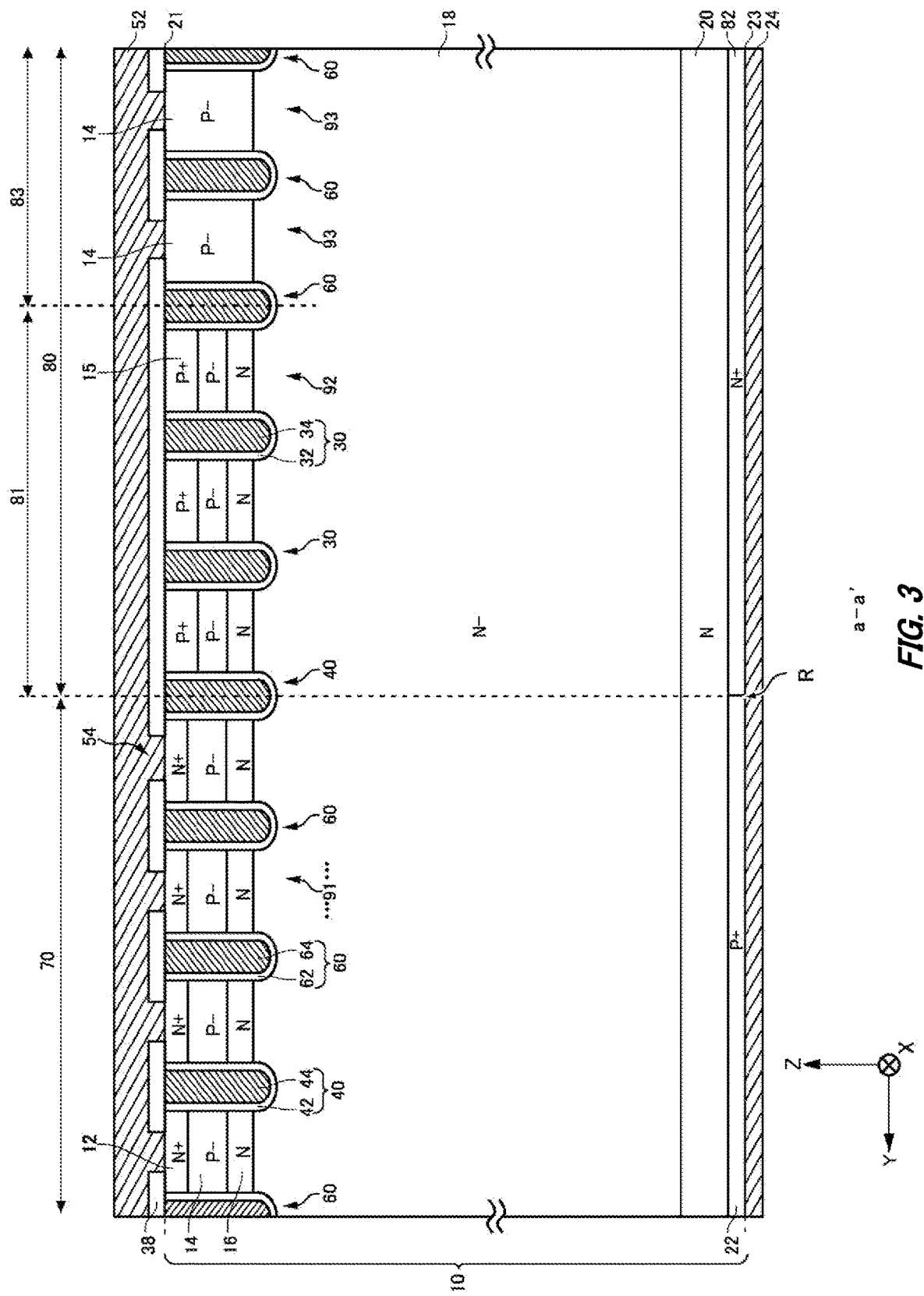
FIG. 3 is a modified example of the semiconductor device 100.

FIG. 3 is a modified example of the semiconductor device 100. In the semiconductor device 100 of the present modified example, the contact hole 54 is not provided above at least a part of the second mesa section 92 adjacent to the dummy trench section 30, in the boundary region 81. In the semiconductor device 100 of the present modified example, the contact hole 54 is not provided above all the second mesa sections 92 adjacent to the dummy trench sections 30, in the boundary region 81. That is, the second mesa section 92 adjacent to the dummy trench section 30 is not electrically connected to the emitter electrode 52. In the meantime, the configuration in which the contact hole 54 is not provided above a part or all of the mesa sections in the boundary region 81 can be applied to the first and second embodiments, and third to fifth embodiments, which will be described later.

Figure 4:
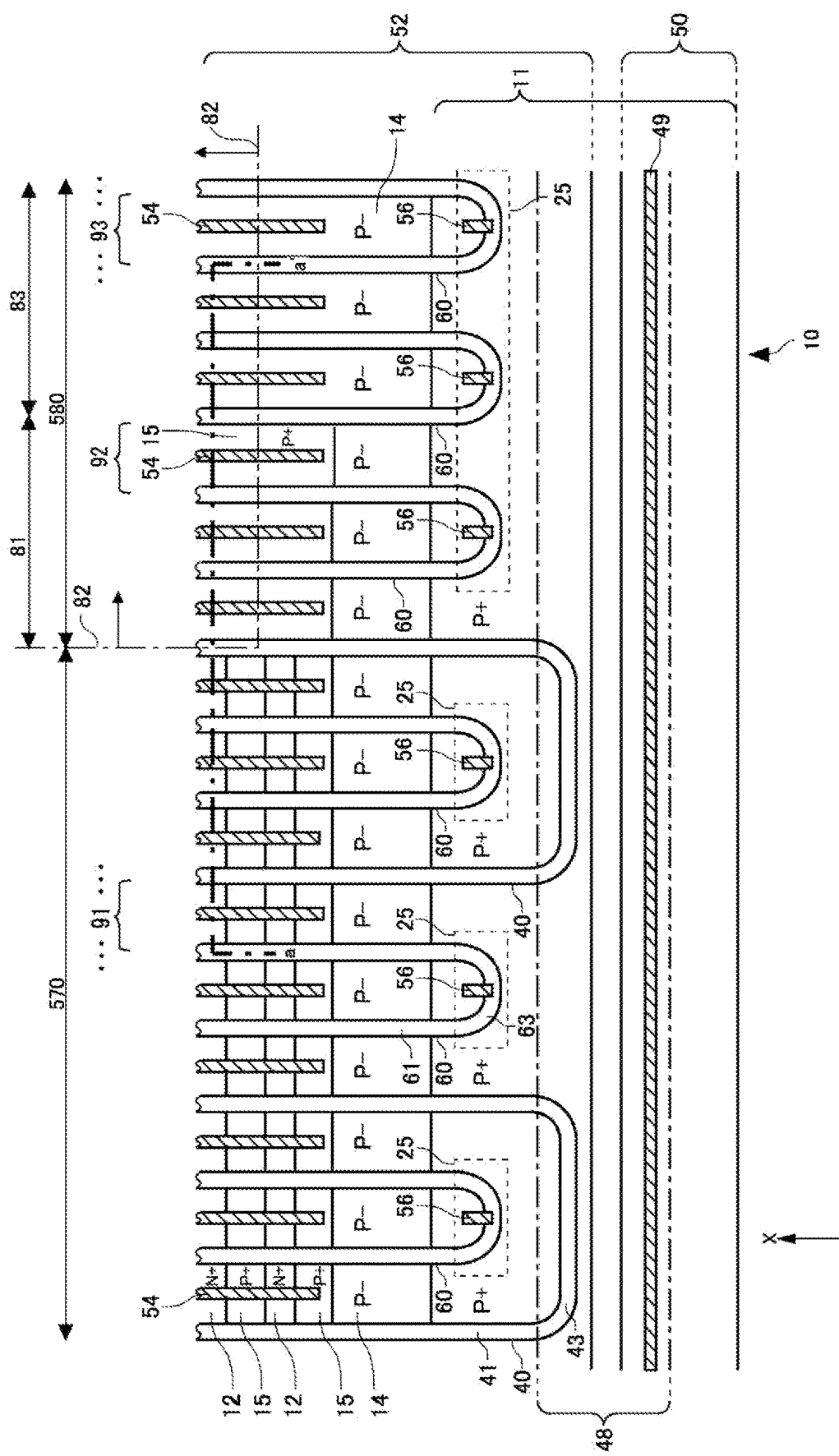
FIG. 4 is a top view of a semiconductor device 500 according to a comparative example.

FIG. 4 is a top view of a semiconductor device 500 according to a comparative example. The semiconductor device 500 of the present comparative example is different from the semiconductor device 100 of the first embodiment, in that the dummy trench section 30 is not provided. The semiconductor device 500 has a transistor section 570 and a diode section 580.

The semiconductor device 500 has the emitter trench section 60 on a boundary-side of the diode section 580 with the transistor section 570. That is, the semiconductor device 500 of the present comparative example is not provided with the dummy trench section 30 in the boundary region 81. That is, since the trench sections except the gate trench section 40 are not connected to the gate metal layer 50, the capacitance between the gate and the emitter is reduced, as compared to the semiconductor device 100 according to the first embodiment.

Here, when noise occurs in the semiconductor device 500 while the semiconductor device 500 performs an FWD operation, a potential difference of a threshold voltage Vth or higher is generated, so that the transistor section 570 may become erroneously on. The lower the capacitance between the gate and the emitter is, the greater an influence of the noise on the semiconductor device 500 is. When the transistor section 570 become erroneously on, short-circuit current flows to enter a short-circuit mode during a reverse recovery operation, so that the semiconductor device 500 may be destroyed.

On the other hand, since the semiconductor device 100 has the dummy trench sections 30, the capacitance between the gate and the emitter increases. Thereby, even when the noise occurs in the semiconductor device 100, the transistor section 70 is difficult to be erroneously on. Like this, the configuration in which the dummy trench sections 30 are provided is equivalent to a configuration in which a noise cut capacitor is provided. Thereby, the influence of the noise on the semiconductor device 100 is reduced.

Figure 5:
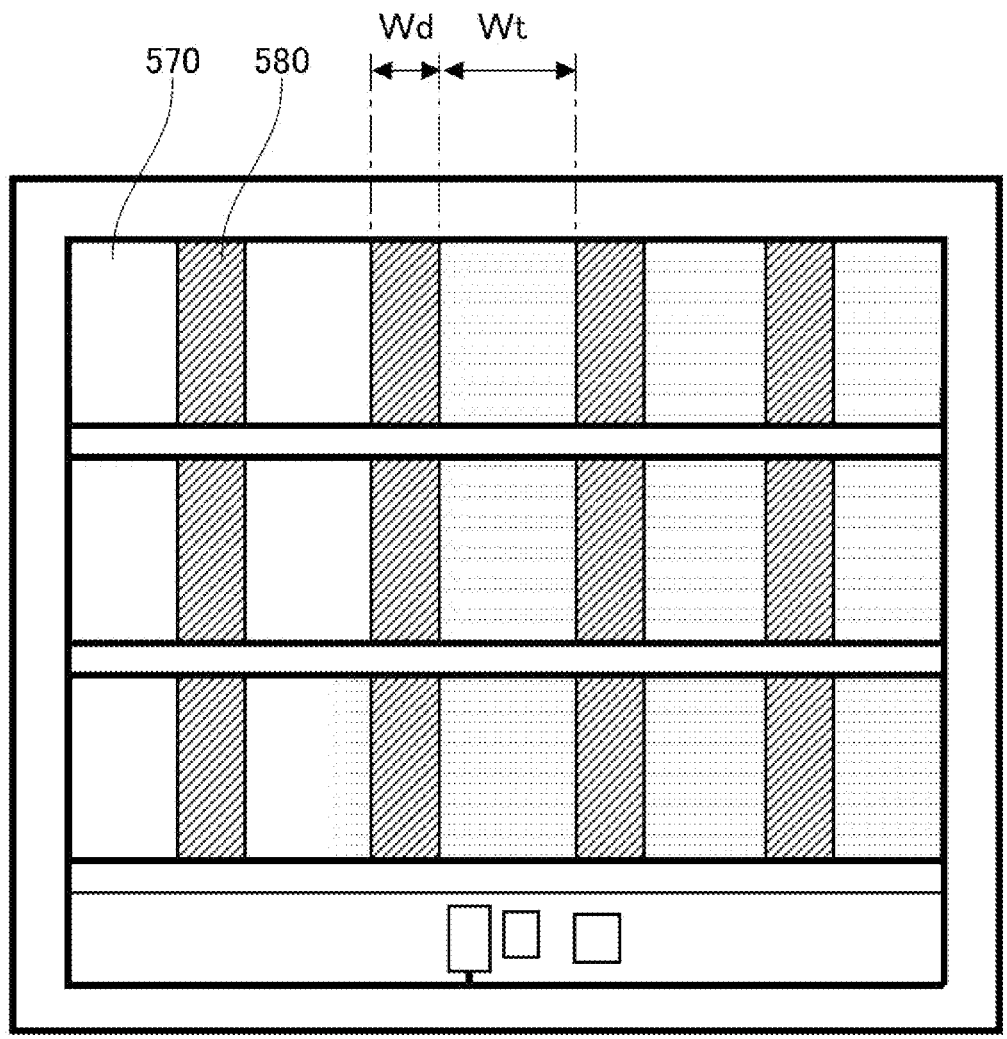
FIG. 5 shows an example of an entire chip diagram of the semiconductor device 500.

FIG. 5 shows an example of an entire chip diagram of the semiconductor device 500 according to the comparative example. The semiconductor device 500 of the present comparative example has a plurality of transistor sections 570 and a plurality of diode sections 580.

In the semiconductor device 500 of the present comparative example, a width Wd of the diode section 580 in the Y-axis direction is smaller than a width Wt of the transistor section 570 in the Y-axis direction. Also, in the present comparative example, a width of the transistor section 570 in the X-axis direction is the same as a width of the diode section 580 in the X-axis direction. A total area of the plurality of diode sections 580 is smaller than a total area of the plurality of transistor sections 570.

During a switching operation, current on the transistor section 570-side may be gradually concentrated on the diode section 580-side, in the semiconductor device 500. In this case, heat is locally generated and the semiconductor device 500 may be destroyed. Like this, while the current uniformly flows during a turn-off operation, the current intends to flow and is concentrated toward the cathode region over time. In the semiconductor device 500, since the width Wd of the diode section 580 in the Y-axis direction is smaller than the width Wt of the transistor section 570 in the Y-axis direction, the heat generation due to the current concentration is remarkable. In particular, when the switching operation is performed with a high current density, the semiconductor device 500 may be destroyed.

Figure 6:
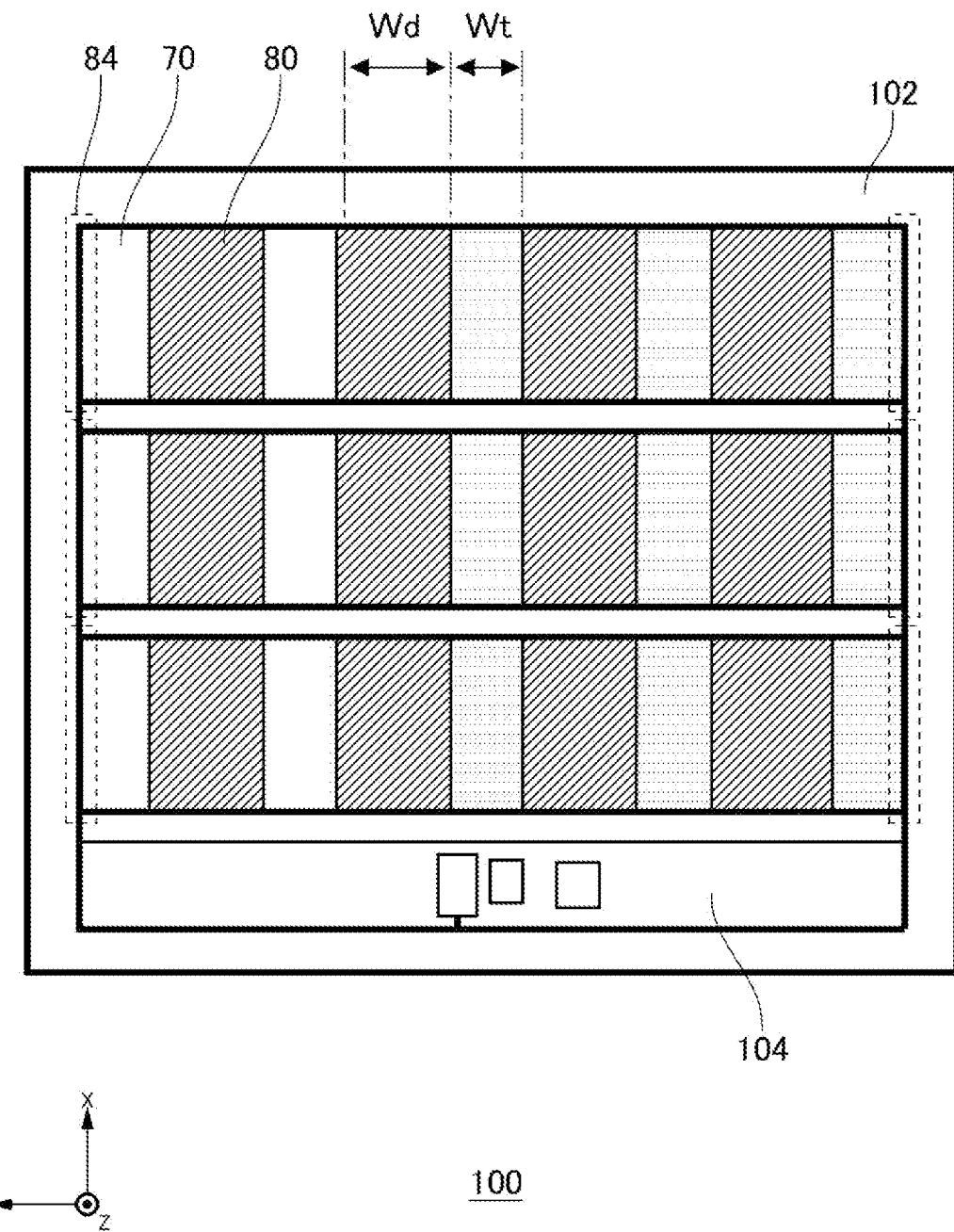
FIG. 6 shows an example of an entire chip diagram of the semiconductor device 100.

FIG. 6 shows an example of an entire chip diagram of the semiconductor device 100. The semiconductor device 100 of the present example has a plurality of transistor sections 70 and a plurality of diode sections 80. The semiconductor device 100 has an edge termination region 102 and an outer region 104 on outer sides of the active region in which the transistor sections 70 and the diode sections 80 are provided.

The edge termination region 102 lessens electric field concentration on the upper surface side of the semiconductor substrate 10. The edge termination region 102 includes, for example, a guard ring, a field plate, a RESURF, and a combination thereof.

The outer region 104 is provided in the vicinity of the transistor sections 70 and the diode sections 80. The outer region 104 includes, for example, a gate pad, a sense section and a temperature detection section.

The semiconductor device 100 of the present example has the fifteen transistor sections 70 and the twelve diode sections 80. In the semiconductor device 100 of the present example, a width Wd of the diode section 80 in the Y-axis direction is equal to or greater than a width Wt of the transistor section 70 in the Y-axis direction, and is preferably greater than the width Wt in the Y-axis direction. For example, the width Wd of the diode section 80 in the Y-axis direction may be 500 μm or greater, 1000 μm or greater, or 1500 μm or greater. Also, in the present example, a width of the transistor section 70 in the X-axis direction is the same as a width of the diode section 80 in the X-axis direction. In the semiconductor device 100 of the present example, a total area of the diode sections 80 is equal to or greater than a total area of the transistor sections and is preferably greater than the total area of the transistor sections 70.

In the semiconductor device 100 of the present example, since the width Wd of the diode section 80 in the Y-axis direction is equal to or greater than the width Wt of the transistor section 70 in the Y-axis direction, the current flowing in the transistor section 70 flows also in the cathode region 82 of the diode section 80, so that it is possible to lessen the current concentration. Therefore, the current concentration is lessened, so that the semiconductor device 100 of the present example is difficult to be destroyed.

The total area of the diode sections 80 may be greater than the total area of the transistor sections 70 by 1.2 times, 1.5 times or 2.0 times. A ratio of the total area of the transistor sections 70 and the total area of the diode sections 80 is set from a standpoint of tradeoff of conduction loss and the current concentration of the semiconductor device 100. That is, as the total area of the transistor sections 70 increases, the conduction loss tends to decrease. On the other hand, as the total area of the diode sections 80 increases, the current concentration tends to be lessened.

When the semiconductor device 100 has the diode sections 80 having the total area equal to or greater than the total area of the transistor sections 70, the capacitance between the gate and the emitter is reduced, as compared to a case in which the total area of the diode sections 80 is smaller than the total area of the transistor sections 70. However, in the semiconductor device 100 of the present example, the dummy trench section 30 is provided in the boundary region 81, so that the reduction in capacitance between the gate and the emitter can be suppressed.

Meanwhile, in a case in which the semiconductor device 100 has a fixed size of a semiconductor chip, the numbers of the transistor sections 70 and the diode sections may be reduced while setting the total area of the diode sections 80 to be equal to or greater than the total area of the transistor sections 70. Thereby, since an interface region between the transistor section 70 and the diode section 80, i.e., the boundary region 81 for preventing interference between the transistor section 70 and the diode section 80 is reduced, the current loss is reduced.

The semiconductor device 100 of the present example has the transistor sections 70 more than the diode sections 80 in the Y-axis direction. Thereby, the transistor sections 70 are arranged at both ends in the Y-axis direction. The transistor sections 70 are provided at both ends in the Y-axis direction, so that the current concentration is difficult to occur in the diode section 80.

For example, the semiconductor device 100 of the present example has the five transistor sections 70 and the four diode sections 80 in the Y-axis direction. However, the numbers of the transistor sections 70 and the diode sections 80 in the Y-axis direction are not limited thereto. For example, the numbers of the transistor sections and the diode sections 80 may be four and three, three and two or two and one. Also, the numbers of the transistor sections 70 and the diode sections 80 may be six and five, seven and six or eight and seven. In the meantime, the numbers of the transistor sections 70 and the diode sections 80 in the Y-axis direction may be the same.

Also, the semiconductor device 100 has three rows of the transistor sections 70 and the diode sections 80 in the X-axis direction, respectively. However, the number of the rows of the transistor sections 70 and the diode sections 80 in the X-axis direction is not limited thereto. For example, the number of the rows of the transistor sections and the diode sections 80 in the X-axis direction may be one row, two rows, four rows or five rows or more.

Figure 7A:
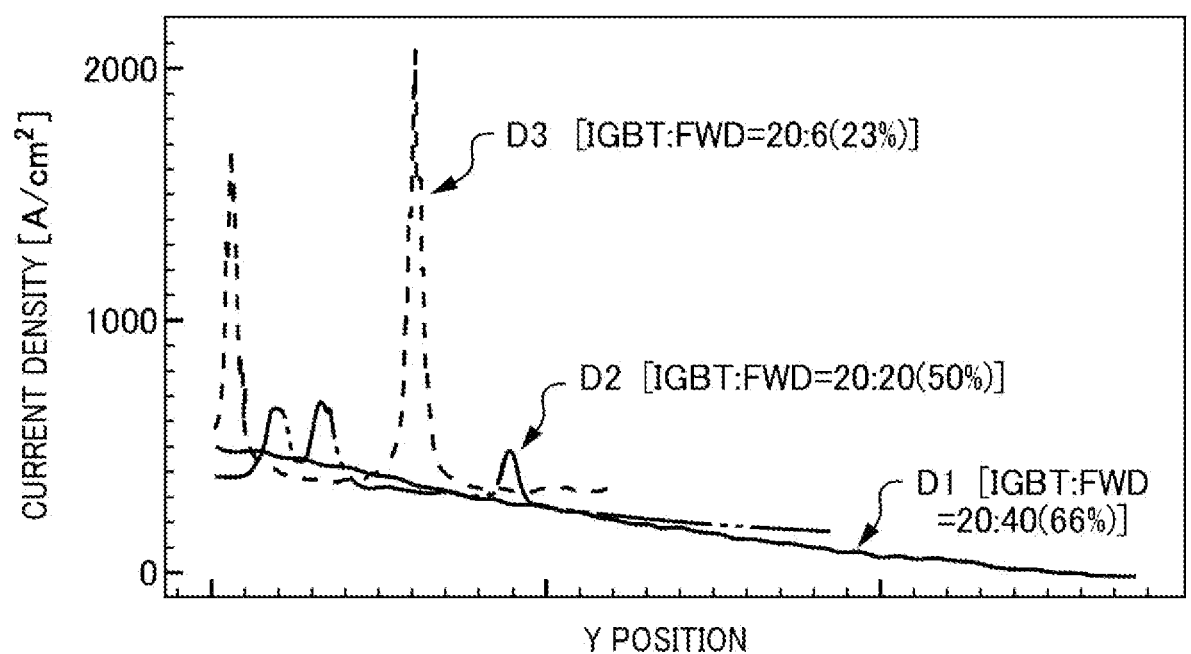
FIG. 7A is a graph showing a current density distribution.

FIG. 7A is a graph showing a current density distribution. A vertical axis indicates the current density [A/cm$^2$], and a horizontal axis indicates any position in the Y-axis direction.

A distribution D1 indicates the current density distribution when the semiconductor device 100 is used. In the semiconductor device 100 of the present example, the ratio of the total area of the transistor sections 70 and the total area of the diode sections 80 is 20:40. That is, the total area of the diode sections 80 corresponds to about 66% of a total area of the transistor sections 70 and diode sections 80.

A distribution D2 indicates the current density distribution when the semiconductor device 100 is used. In the semiconductor device 100 of the present example, the ratio of the total area of the transistor sections 70 and the total area of the diode sections 80 is 20:20. That is, the total area of the diode sections 80 corresponds to 50% of the total area of the transistor sections 70 and diode sections 80.

A distribution D3 indicates the current density distribution when the semiconductor device 500 is used. In the semiconductor device 500 of the present example, the ratio of the total area of the transistor sections 570 and the total area of the diode sections 580 is 20:6. That is, the total area of the diode sections 580 corresponds to about 23% of the total area of the transistor sections 570 and diode sections 580.

Comparing the distribution D1 to the distribution D3, as the ratio of the diode sections 80 increases, a maximum value of the current density decreases. That is, the semiconductor device 100 can reduce the maximum value of the current density by setting the total area of the diode sections 80 to be equal to or greater than the total area of the transistor sections 70.

Figure 7B:
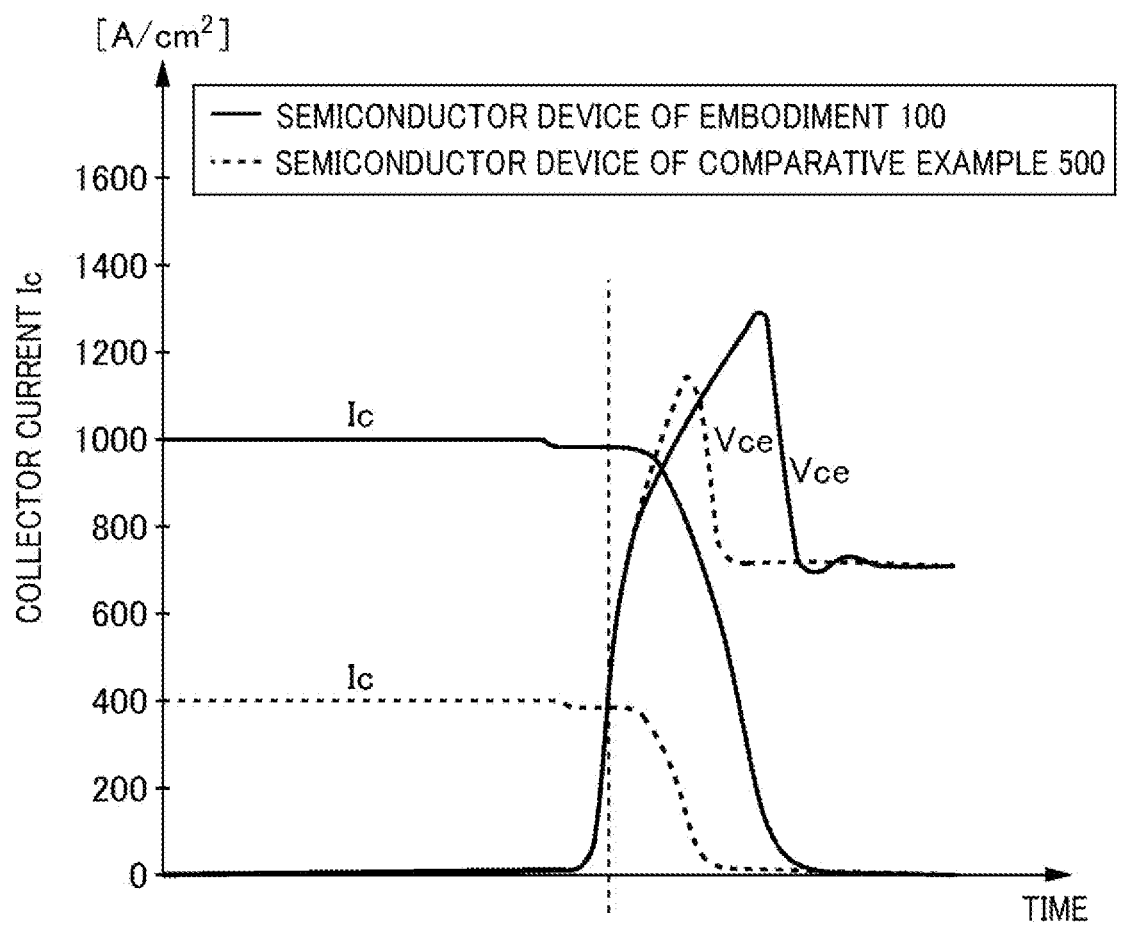
FIG. 7B is a graph showing turn-off waveforms of the semiconductor device 100 and the semiconductor device 500.

FIG. 7B is a graph showing turn-off waveforms of the semiconductor device 100 and the semiconductor device 500. The graph shows changes in the collector current Ic [A/cm$^2$] and the voltage Vce between the collector and the emitter over time. The collector current Ic of the semiconductor device 100 is higher than the collector current Ic of the semiconductor device 500. That is, the semiconductor device 100 can implement the switching operation of the higher current density than the semiconductor device 500 because the width of the diode section 80 is set greater than the width of the transistor section 70.

FIGS. 8A to 8D are views for comparing the conduction current density distributions when the ratio of gate trench sections G and emitter trench sections E is changed. A vertical axis indicates the conduction current density distribution [A/cm$^2$], and a horizontal axis indicates positions in the Y-axis direction in the vicinity of the transistor section and the diode section. The gate trench section G is a trench section electrically connected to the gate metal layer 50 and provided in contact with the emitter region 12. The emitter trench section E is a trench section electrically connected to the emitter electrode 52.

Figure 8A:
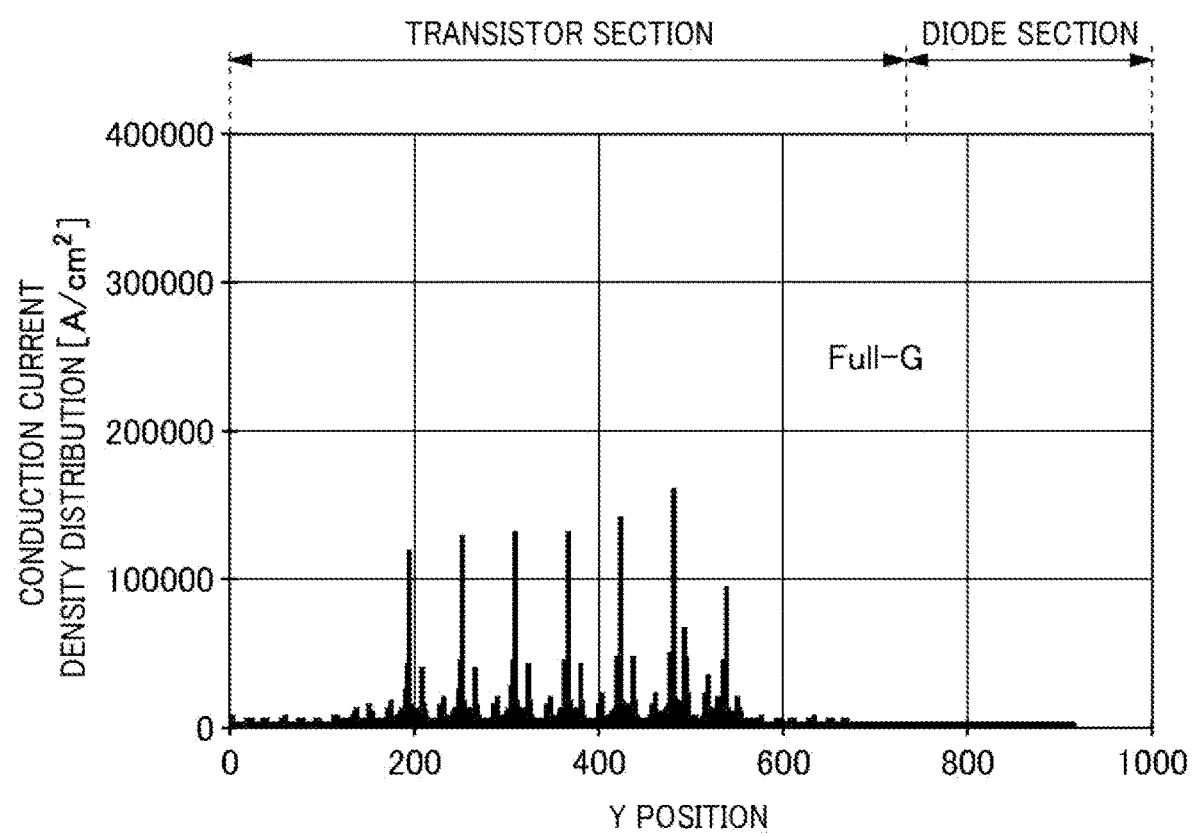
FIG. 8A shows a conduction current density distribution of a semiconductor device with a full gate.

FIG. 8A shows a conduction current density distribution of a semiconductor device with a full gate. In the semiconductor device of the present example, all the trench sections are the gate trench sections G. That is, in the semiconductor device of the present example, all the trench sections are electrically connected to the gate metal layer 50.

Figure 8B:
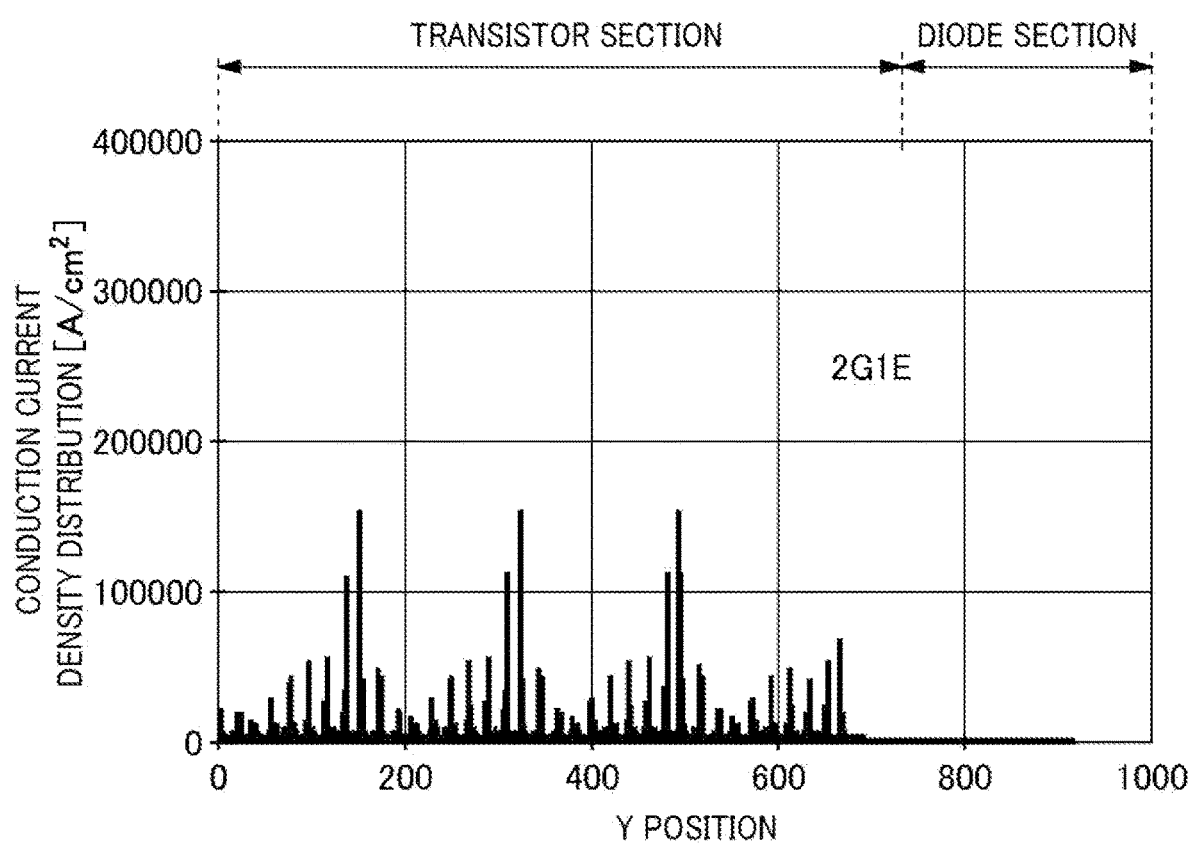
FIG. 8B shows a conduction current density distribution of a semiconductor device having emitter trench sections E.

FIG. 8B shows a conduction current density distribution of a semiconductor device having emitter trench sections E. In the semiconductor device of the present example, the ratio of the gate trench sections G and the emitter trench sections E is 2:1. That is, in the semiconductor device of the present example, the number of the gate trench sections G is greater than the number of the emitter trench sections E.

Figure 8C:
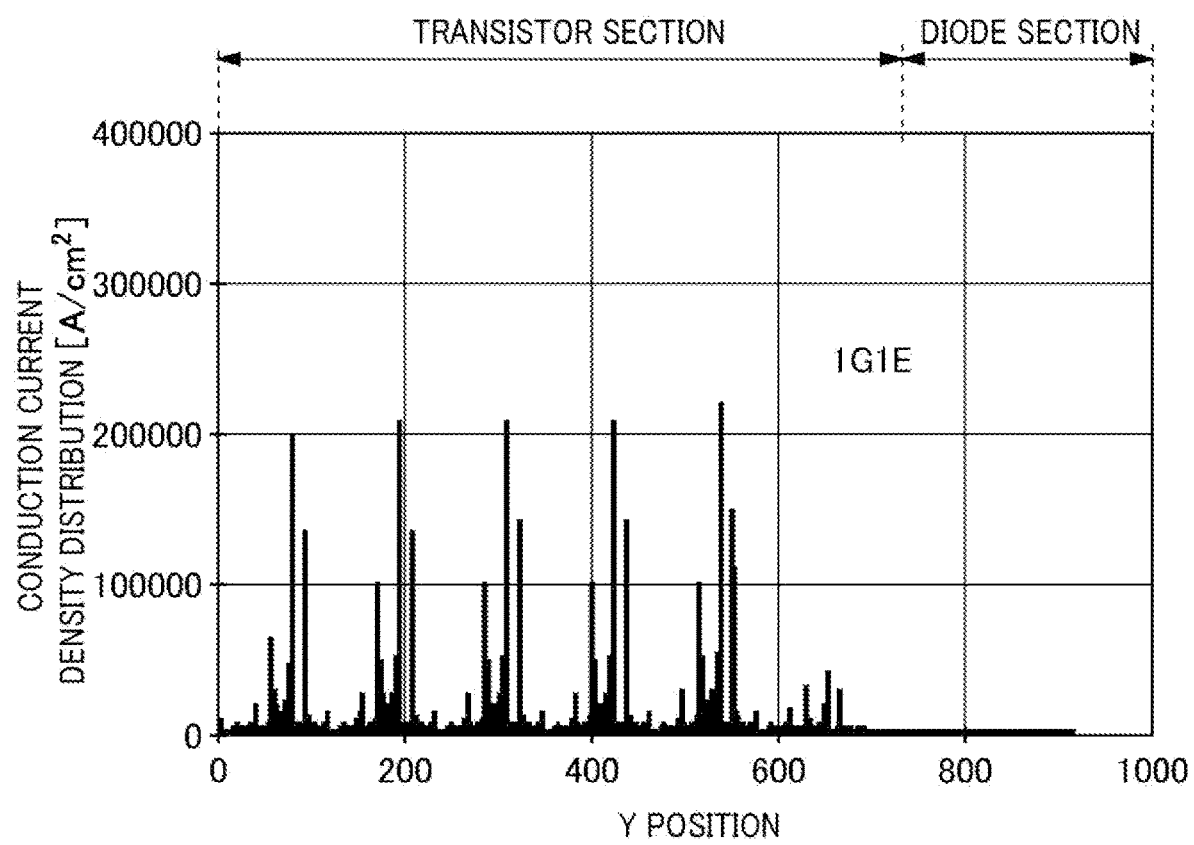
FIG. 8C shows a conduction current density distribution of a semiconductor device having the emitter trench sections E.

FIG. 8C shows a conduction current density distribution of a semiconductor device having the emitter trench sections E. In the semiconductor device 500 of the present example, the ratio of the gate trench sections G and the emitter trench sections E is 1:1. That is, in the semiconductor device of the present example, the number of the gate trench sections G is the same as the number of the emitter trench sections E.

Figure 8D:
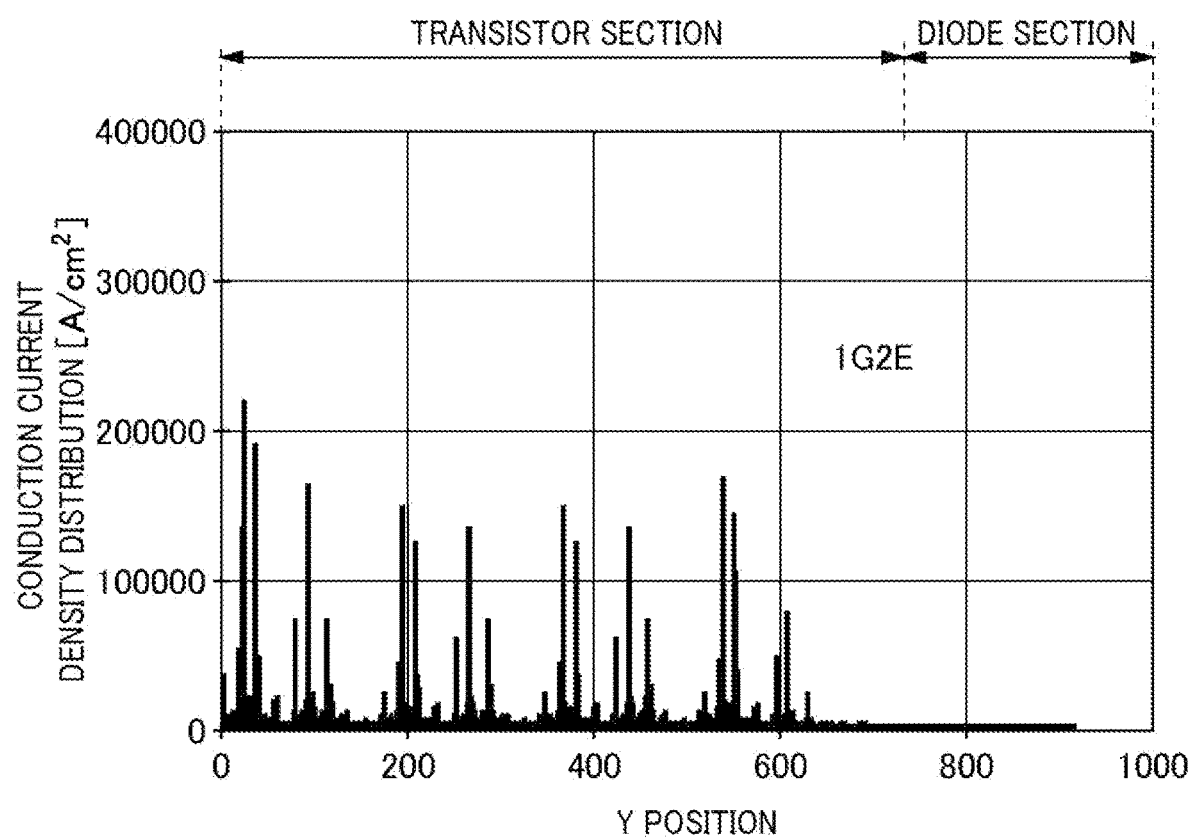
FIG. 8D shows a conduction current density distribution of a semiconductor device having the emitter trench sections E.

FIG. 8D shows a conduction current density distribution of the semiconductor device having the emitter trench sections E. In the semiconductor device 500 of the present example, the ratio of the gate trench sections G and the emitter trench sections E is 1:2. That is, in the semiconductor device of the present example, the number of the gate trench sections G is smaller than the number of the emitter trench sections E.

Referring to the conduction current density distributions of FIGS. 8A to 8D, when the ratio of the emitter trench sections E is increased, as compared to the gate trench sections G, the conduction current density distribution tends to be enlarged. For example, the conduction current density distribution of FIG. 8A tends to be localized in a specific region, as compared to the other examples. Also, when the ratio of the emitter trench sections E is increased, the channel region is reduced, so that the maximum value of the conduction current tends to increase.

Here, an example of a method of designing the semiconductor device 100 in which the influence of the noise is reduced while suppressing the current concentration is described. In the semiconductor device with a full gate, all the trench sections are electrically connected to the gate metal layer 50, so that the potential around the trench sections may be deflected. For this reason, the semiconductor device preferably has both the gate trench section G and the emitter trench section E. However, as shown in FIGS. 8A to 8D, when the ratio of the emitter trench sections E is increased, as compared to the gate trench sections G, the maximum value of the conduction current density distribution tends to increase.

In order to suppress the maximum value of the conduction current density distribution, if the ratio of the total area of the diode sections 80 to the total area of the transistor sections 70 is increased, it is possible to suppress the breakdown of the semiconductor device 100. Particularly, in the first embodiment, the boundary region 81 is provided in the diode section 80. The boundary region 81 is provided in the diode section 80, so that the cathode region 82 becomes relatively longer and the collector region 22 becomes relatively shorter. For this reason, the electrons emitted from the emitter region 12 can be easily introduced into the collector region 22, so that it is possible to effectively lower the maximum value of the current density.

On the other hand, if the ratio of the total area of the diode sections 80 to the total area of the transistor sections 70 is increased, the capacitance between the gate and the emitter is lowered. Therefore, the semiconductor device 100 is provided with the dummy trench section 30 in the boundary region 81, so that it is possible to secure the capacitance between the gate and the emitter while lessening the current concentration by the increase of the diode sections 80. Thereby, it is possible to implement the semiconductor device 100 in which the influence of the noise is reduced while suppressing the element breakdown due to the current concentration.

In the meantime, the dummy trench section 30 described above may be provided to extend in the X-axis direction toward the edge termination region 102 of the transistor section 70 adjacent to the edge termination region 102, without being limited to the boundary region 81 in which the transistor section 70 and the diode section 80 are adjacent to each other. That is, the edge termination region 102-side of the transistor section 70 adjacent to the edge termination region 102 may be provided with the dummy trench section 30 that is not in contact with the emitter region 12. The edge termination region 102-side of the transistor section 70, on which the dummy trench section 30 is provided, is shown as an edge neighboring region 84 by the broken line. The edge neighboring region 84 is a region that is adjacent to the edge termination region 102 on a positive side or negative side of the transistor section 70 in the Y-axis direction. Thereby, while securing the capacitance between the gate and the emitter, it is possible to suppress the concentration of carriers by forming an ineffective region, which does not function as a transistor, on the edge termination region 102-side of the transistor section 70. Therefore, the number of the dummy trench sections 30 to be inserted in the edge neighboring region 84 may be greater than the number of the dummy trench sections 30 to be inserted in the boundary region 81. Also, the dummy trench section 30 may be provided in only the edge neighboring region 84. When providing the dummy trench section 30 in the edge neighboring region 84, the width Wt of the transistor section 70 in the Y-axis direction and the width Wd of the diode section in the Y-axis direction are not limited.

Figure 9:
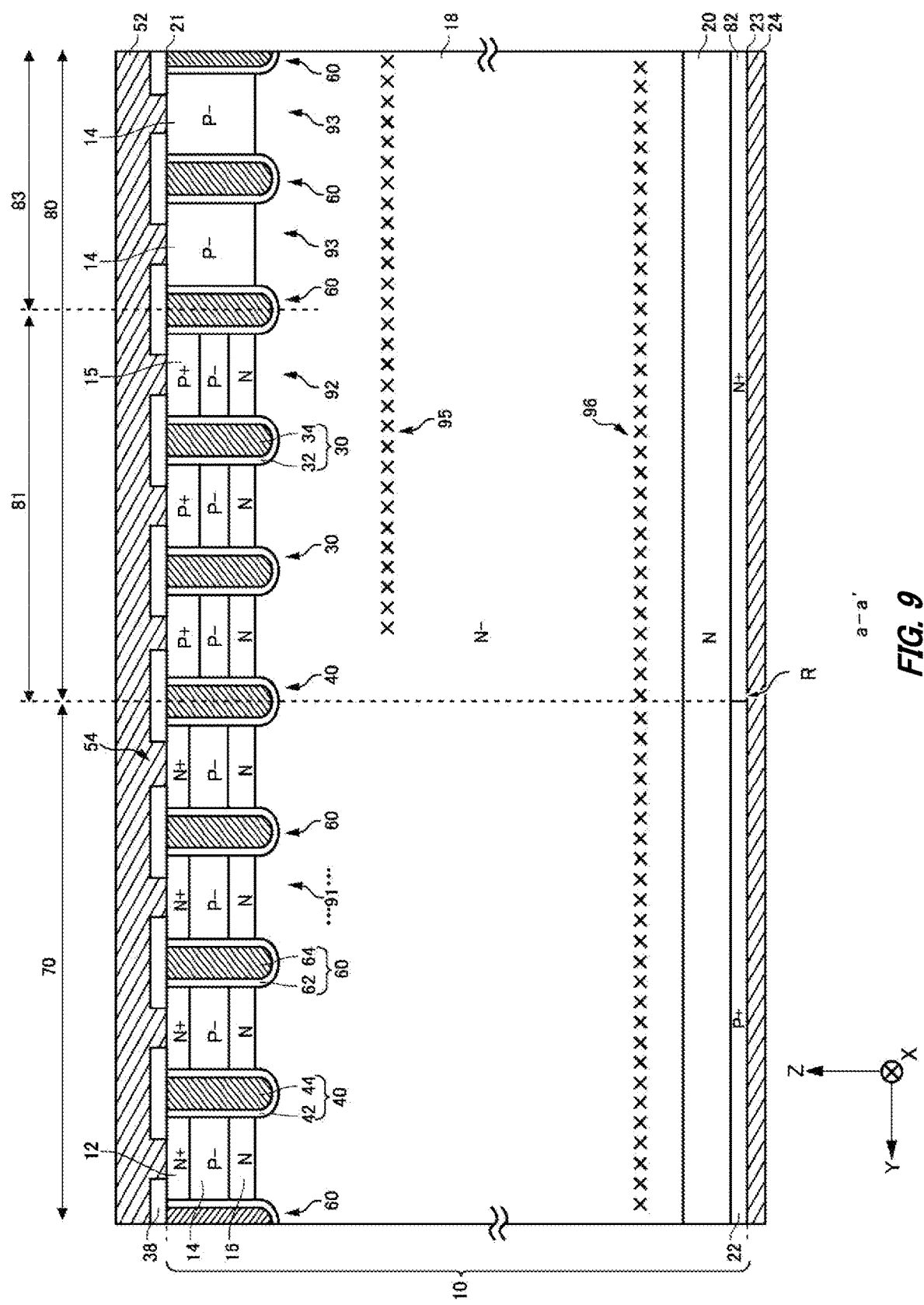
FIG. 9 shows an example of a configuration of the semiconductor device 100 according to a third embodiment.

FIG. 9 shows an example of a configuration of the semiconductor device 100 according to a third embodiment. The semiconductor device 100 of the present example is different from the semiconductor device 100 according to the first embodiment, in that it has an upper surface lifetime killer 95 and a lower surface lifetime killer 96.

The upper surface lifetime killer 95 and the lower surface lifetime killer 96 are used to adjust lifetime of carriers. The upper surface lifetime killer 95 and the lower surface lifetime killer 96 are provided by injecting ions from the upper surface side or lower surface side of the semiconductor substrate 10. For example, the upper surface lifetime killer 95 and the lower surface lifetime killer 96 are formed by injection of helium.

The upper surface lifetime killer 95 is provided on the upper surface side of the semiconductor substrate 10. For example, the upper surface lifetime killer 95 of the third embodiment is provided in the diode section 80. The upper surface lifetime killer of the present example is provided with extending from the non-boundary region 83 to at least a part of the boundary region 81. The upper surface lifetime killer 95 can reduce the carrier lifetime on the anode region side of the diode section 80, thereby reducing tail current to decrease reverse recovery loss Err.

The upper surface lifetime killer 95 may be provided in the transistor section or not. That is, the upper surface lifetime killer 95 of the present example is provided with extending from the non-boundary region 83 to a part of the boundary region 81 but may be provided with extending to the boundary R or may be provided with extending to the transistor section 70 beyond the boundary R. Also, in the present example, the region in which the collector region provided on the lower surface side of the semiconductor substrate 10 is projected to the upper surface of the semiconductor substrate 10 is set as the transistor section 70, and the region except the transistor section 70, in which the cathode region 82 is projected to the upper surface of the semiconductor substrate 10, is set as the diode section 80. However, a region in which the upper surface lifetime killer 95 is not provided may be set as the transistor section and a region in which the upper surface lifetime killer 95 is provided may be set as the diode section 80.

The lower surface lifetime killer 96 is provided on the lower surface side of the semiconductor substrate 10. The lower surface lifetime killer 96 of the present example is provided in both the transistor section 70 and the diode section 80. A concentration of the lower surface lifetime killer 96 may be lower on the transistor section 70-side than on the diode section 80-side. For example, the concentration of the lower surface lifetime killer 96 in the boundary region 81 of the diode section 80 is lower than the concentration of the lower surface lifetime killer 96 in the non-boundary region 83 of the diode section 80. Thereby, the current can easily flow through the cathode region 82, so that the current concentration can be easily lessened in the transistor section 70.

The cathode region 82 further extends toward the transistor section 70 than the upper surface lifetime killer 95. Thereby, the current can easily flow through the cathode region 82, so that the current concentration can be easily lessened in the transistor section 70.

Also, a concentration of the cathode region 82 may be higher on the transistor section 70-side than on the diode section 80-side. For example, the concentration of the cathode region 82 in the boundary region 81 of the diode section 80 is higher than the concentration of the cathode region 82 in the non-boundary region 83 of the diode section 80. Thereby, the current can further easily flow through the cathode region 82, so that the current concentration can be easily lessened in the transistor section 70.

Figure 10:
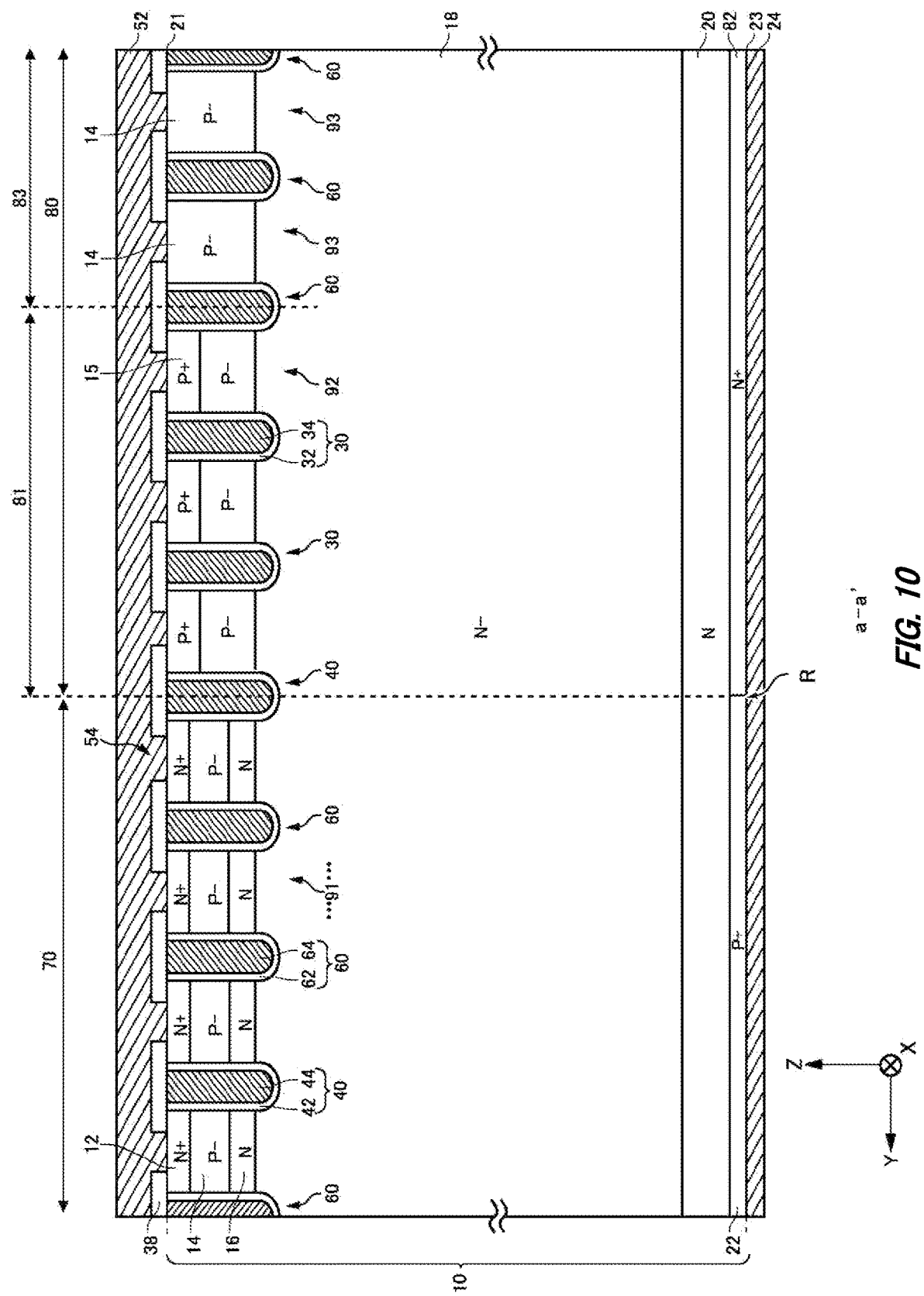
FIG. 10 shows an example of a configuration of the semiconductor device 100 according to a fourth embodiment.

FIG. 10 shows an example of a configuration of the semiconductor device 100 according to a fourth embodiment. The semiconductor device 100 of the present example is different from the semiconductor device 100 according to the first embodiment, in terms of the structure of the boundary region 81.

The accumulation region 16 is provided in the transistor section 70. The accumulation region 16 is not provided in the boundary region 81. That is, the accumulation region 16 is not provided in the second mesa section 92 adjacent to the dummy trench section 30. The second mesa section 92 is provided with the contact region 15. In the semiconductor device 100 of the present example, since the accumulation region 16 is not provided in the second mesa section 92 positioned between the dummy trench sections 30, it is possible to easily extract holes toward the emitter electrode 52 in the boundary region 81.

Figure 11:
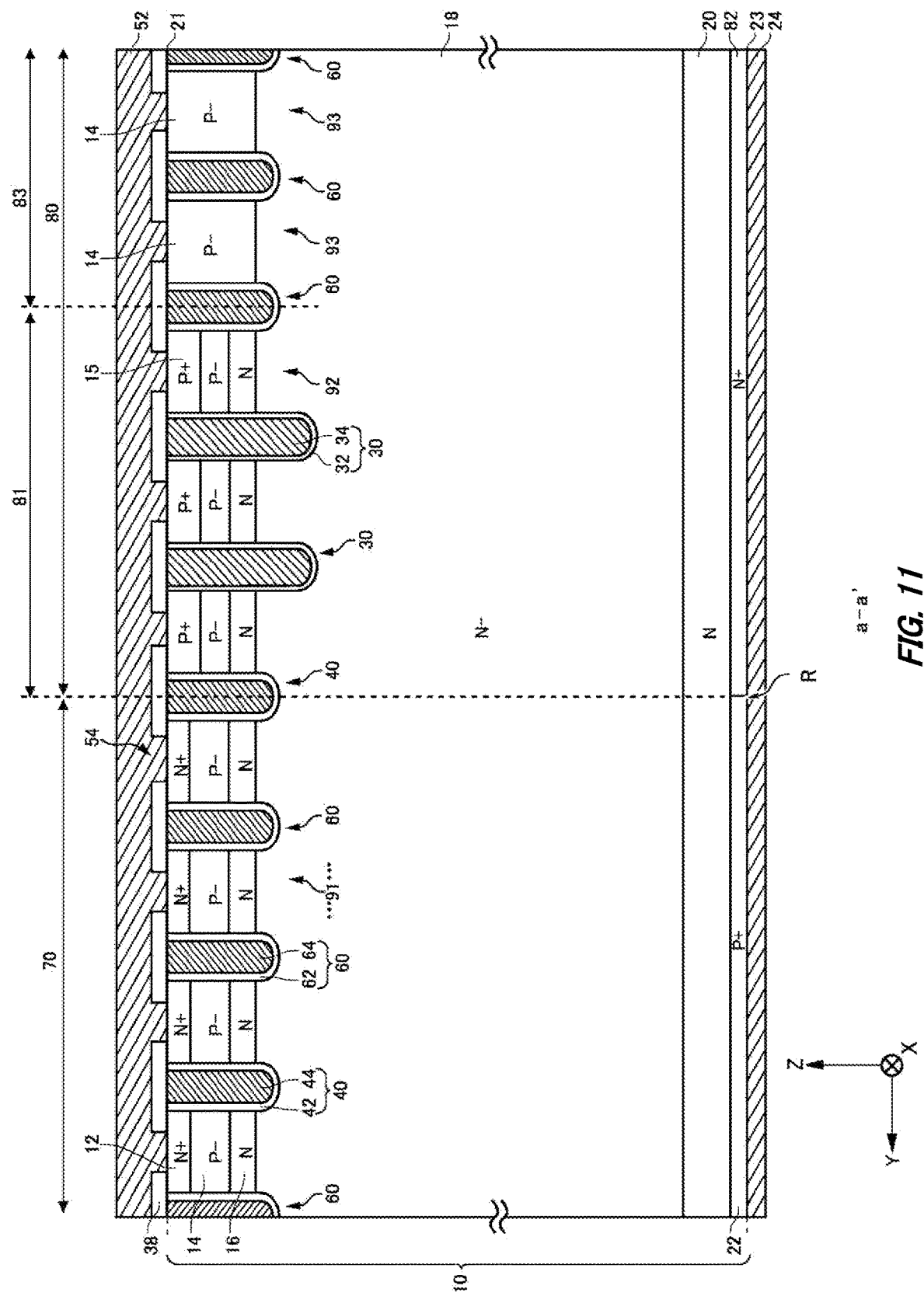
FIG. 11 shows an example of a configuration of the semiconductor device 100 according to a fifth embodiment.

FIG. 11 shows an example of a configuration of the semiconductor device 100 according to a fifth embodiment. The semiconductor device 100 of the present example is different from the semiconductor device 100 according to the first embodiment, in terms of the structure of the dummy trench section 30.

The dummy trench section 30 has a shape different from the gate trench section 40 and the emitter trench section 60. The dummy trench section 30 of the present example can adjust the capacitance between the gate and the emitter of the semiconductor device 100 by adjusting an insulating film in the trench and a trench depth.

The film thickness of the dummy insulating film 32 is smaller than the gate insulating film 42 and the emitter insulating film 62. Thereby, the capacitance between the gate and the emitter of the semiconductor device 100 increases. In the present example, the film thickness of the dummy insulating film 32 is made thin without changing a width of the trench formed on the upper surface side of the semiconductor substrate 10. However, the film thickness of the dummy insulating film 32 may be made relatively thin by increasing the width of the trench for providing the gate trench section 40 and the emitter trench section 60 and increasing the film thicknesses of the gate insulating film 42 and the emitter insulating film 62.

A trench depth of the dummy trench section 30 is greater than a trench depth of the gate trench section 40 and a trench depth of the emitter trench section 60. Thereby, the capacitance between the gate and the emitter of the semiconductor device 100 increases. In the meantime, in the present example, the trench depth of the dummy trench section 30 is set large. However, the trench depth of the dummy trench section 30 may be made relatively large by reducing the depth of the trench for providing the gate trench section 40 and the emitter trench section 60.

In the semiconductor device 100 of the present example, the film thickness of the dummy insulating film 32 is made small and the trench depth of the dummy trench section 30 is made large, so that the capacitance between the gate and the emitter can be increased. Thereby, the influence of the noise on the semiconductor device 100 is reduced. In the meantime, the semiconductor device 100 may be configured to increase the capacitance between the gate and the emitter by adjusting one of the film thickness of the dummy insulating film 32 and the trench depth of the dummy trench section 30.

Figure 12:
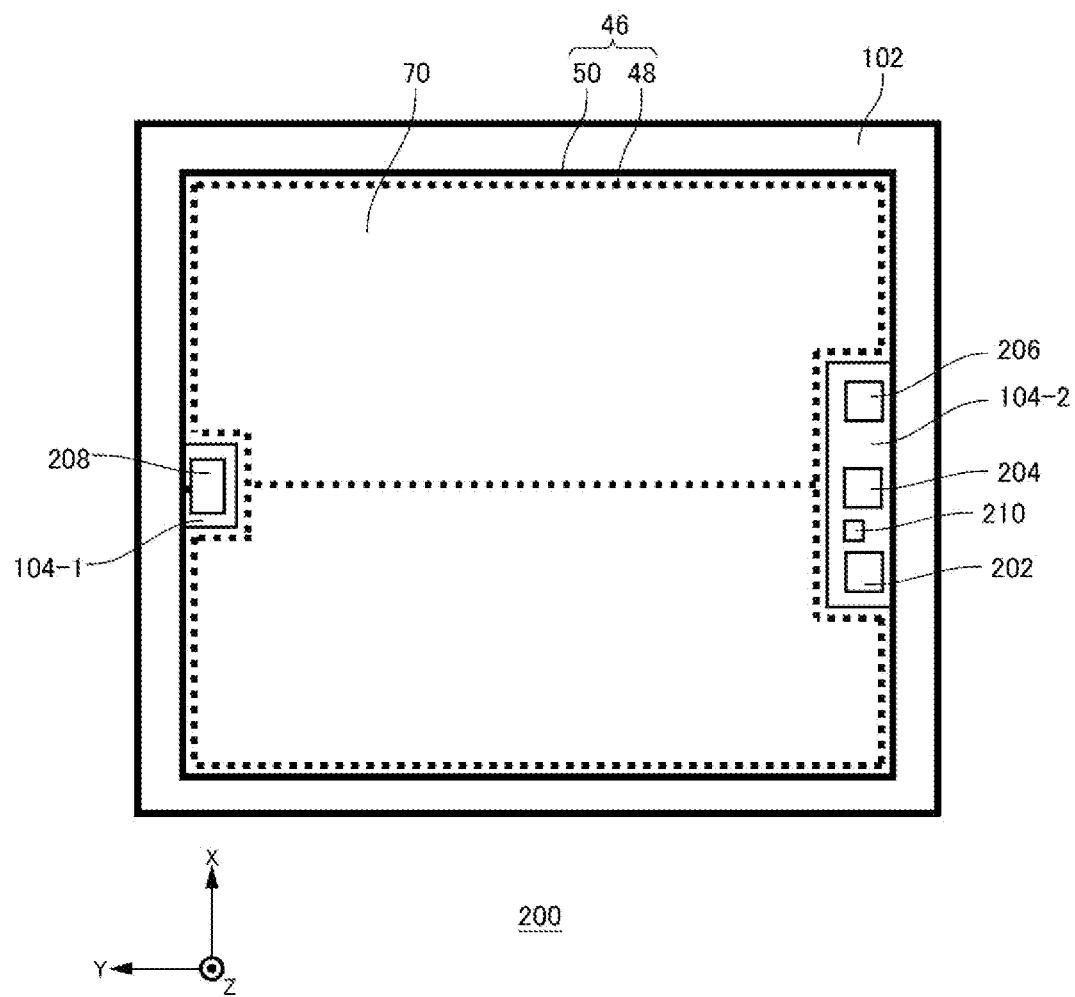
FIG. 12 is an example of a top view showing a semiconductor device 200 according to a sixth embodiment.

FIG. 12 is an example of a top view showing a semiconductor device 200 according to a sixth embodiment. The semiconductor device 200 of the present example has a transistor section 70 and a current sense section 210. A structure of the transistor section 70 may be the same as the transistor section 70 according to any one of the aspects described with reference to FIGS. 1A to 11, may be the same as a partial structure of the transistor section 70 according to any one aspect, or may be different.

The transistor section 70 of the present example includes the gate trench section 40 and the emitter trench section 60. A mesa section in contact with the gate trench section 40 and a mesa section in contact with the emitter trench section 60 may have the same structures as the first mesa section 91 described with reference to FIGS. 1A to 11. Also, the transistor section 70 may further include the dummy trench section and the second mesa section 92 in contact with the dummy trench section 30.

The semiconductor device 200 may further have a diode section 80. In this case, the alignment of the transistor section 70 and the diode section 80 may be the same as the semiconductor device 100 described with reference to FIGS. 1A to 11. Also in the present example, each of the gate trench section 40, the emitter trench section 60 and the dummy trench section 30 is provided with extending in the X-axis direction and is aligned in the Y-axis direction.

The upper surface of the semiconductor substrate 10 of the present example is provided with a gate pad 208 connected to a gate wire section 46, a current sense pad 202 connected to the current sense section 210, an anode pad 204 and a cathode pad 206. The anode pad 204 and the cathode pad 206 are pads that are to be connected to a temperature detection section arranged above the upper surface of the semiconductor substrate 10. The temperature detection section is, for example, a PN diode formed of polysilicon or the like. In the meantime, the pads arranged on the upper surface of the semiconductor substrate 10 are not limited thereto.

As described above, each of the pads is arranged in the outer region 104. The current sense section 210 may also be arranged in the outer region 104. At least a part of the current sense section 210 may be arranged between any two pads, as seen from above. The current sense section 210 is provided in the outer region 104, so that it is possible to suppress reduction in areas of the transistor section 70 and the like.

In the present example, the gate pad 208 and the current sense section 210 and current sense pad 202 are arranged on opposite sides of the upper surface of the semiconductor substrate 10. In the example of FIG. 12, an outer region 104-1 in which the gate pad 208 is provided and an outer region 104-2 in which the current sense section 210 and the current sense pad 202 are provided are arranged with the transistor section 70 being interposed therebetween in the Y-axis direction. In the outer region 104-2, the anode pad 204 and the cathode pad 206 may be arranged. The arrangement of the pads is not limited to the example of FIG. 12. The arrangement of the pads may be similar to the semiconductor device 100 described with reference to FIGS. 1A to 11.

The gate wire section 46 includes the gate metal layer 50 and the gate runner 48. The gate metal layer 50 is arranged to surround the transistor section 70 (the transistor section 70 and the diode section 80 when the diode section 80 is provided), as seen from above. The gate runner 48 may be arranged along the gate metal layer 50. The gate runner 48 may be arranged with being at least partially overlapped below the gate metal layer 50. The gate runner 48 may be arranged with traversing the transistor section 70. The gate runner 48 may be arranged along the outer region 104. The gate runner 48 is connected to the gate trench section 40 and the dummy trench section 30, and is configured to transfer gate voltage.

The current sense section 210 is configured to detect current flowing through the transistor section 70. The current sense section 210 of the present example includes at least one gate trench section 40 and the first mesa section 91. Also in the current sense section 210 of the present example, each of the trench sections is provided with extending in the X-axis direction and is aligned in the Y-axis direction. However, the extension direction and alignment direction of each of the trench sections of the current sense section 210 may be different from the extension direction and alignment direction of each of the trench sections of the transistor section 70.

The current sense section 210 of the present example has a similar structure to the transistor section 70, so that the current flowing through the transistor section 70 is simulated at a ratio corresponding to a channel area ratio, as seen from above. An area of the current sense section 210 is smaller than an area of the transistor section 70, as seen from above. The area of the current sense section 210 may be smaller than an area of each of the pads such as the gate pad 208 arranged on the upper surface of the semiconductor substrate 10.

In the present example, a value obtained by dividing the number G of the gate trench sections 40 included in a unit length in the alignment direction of the respective trench sections by the number E of the emitter trench sections is referred to as a gate emitter ratio G/E. In the meantime, when the dummy trench section 30 is provided, a gate emitter ratio (G+D)/E obtained by dividing a sum of the number G of the gate trench sections 40 and the number D of the dummy trench sections 30 by the number E of the emitter trench sections 60 may be set as the gate emitter ratio.

The gate emitter ratio of the current sense section 210 is greater than the gate emitter ratio of the transistor section 70. That is, in the current sense section 210, the gate trench sections 40 are arranged with a higher density, as compared to the transistor section 70. The gate emitter ratio of the current sense section 210 may be calculated from the number of all the trench sections aligned in the Y-axis direction in the current sense section 210. The gate emitter ratio of the transistor section 70 may also be calculated from the number of all the trench sections aligned in the Y-axis direction in the transistor section 70.

Since the current sense section 210 has a smaller area than the transistor section the insulation strength tends to be lowered. In regard to this point, when the gate emitter ratio of the current sense section 210 is increased, insulating film capacitance between the gate and the emitter in the current sense section 210 can be increased. For this reason, it is possible to suppress an increase in voltage even when charges are injected into each electrode by electrostatic discharge (ESD) and the like. Therefore, it is possible to increase the insulation strength of the current sense section 210. Also, in a case in which the current sense section 210 is not provided with the emitter trench section 60, it is possible to omit a screening test for the emitter trench section 60 of the current sense section 210.

Figure 13:
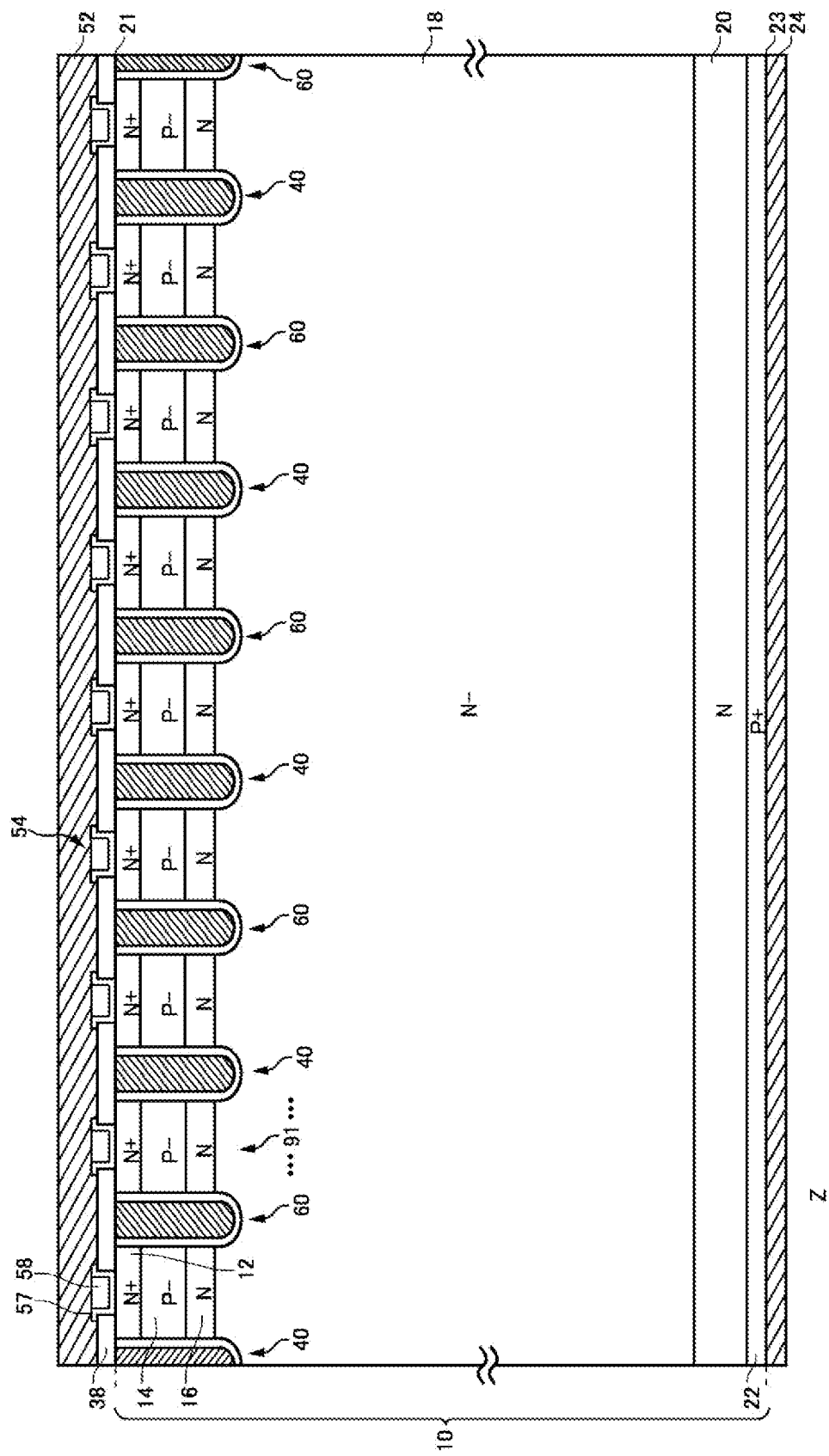
FIG. 13 shows an example of a cross-sectional view of a transistor section 70.

FIG. 13 shows an example of a cross-sectional view of the transistor section In FIG. 13, a YZ cross-section passing the emitter region 12 is shown. In the transistor section 70 of the present example, one gate trench section 40 and one emitter trench section 60 are alternately arranged in the Y-axis direction. In this case, the gate emitter ratio of the transistor section 70 is 1/1=1.

In the meantime, each of the contact holes 54 may be provided with barrier metal 57. The barrier metal 57 may include at least one of a titanium film and a titanium nitride film. The barrier metal 57 may be provided with covering the interlayer dielectric film 38. Also, the contact hole 54 may be provided with a tungsten plug 58. The barrier metal 57 and the tungsten plug 58 may be provided also in the semiconductor device 100 described with reference to FIGS. 1A to 11.

Figure 14:
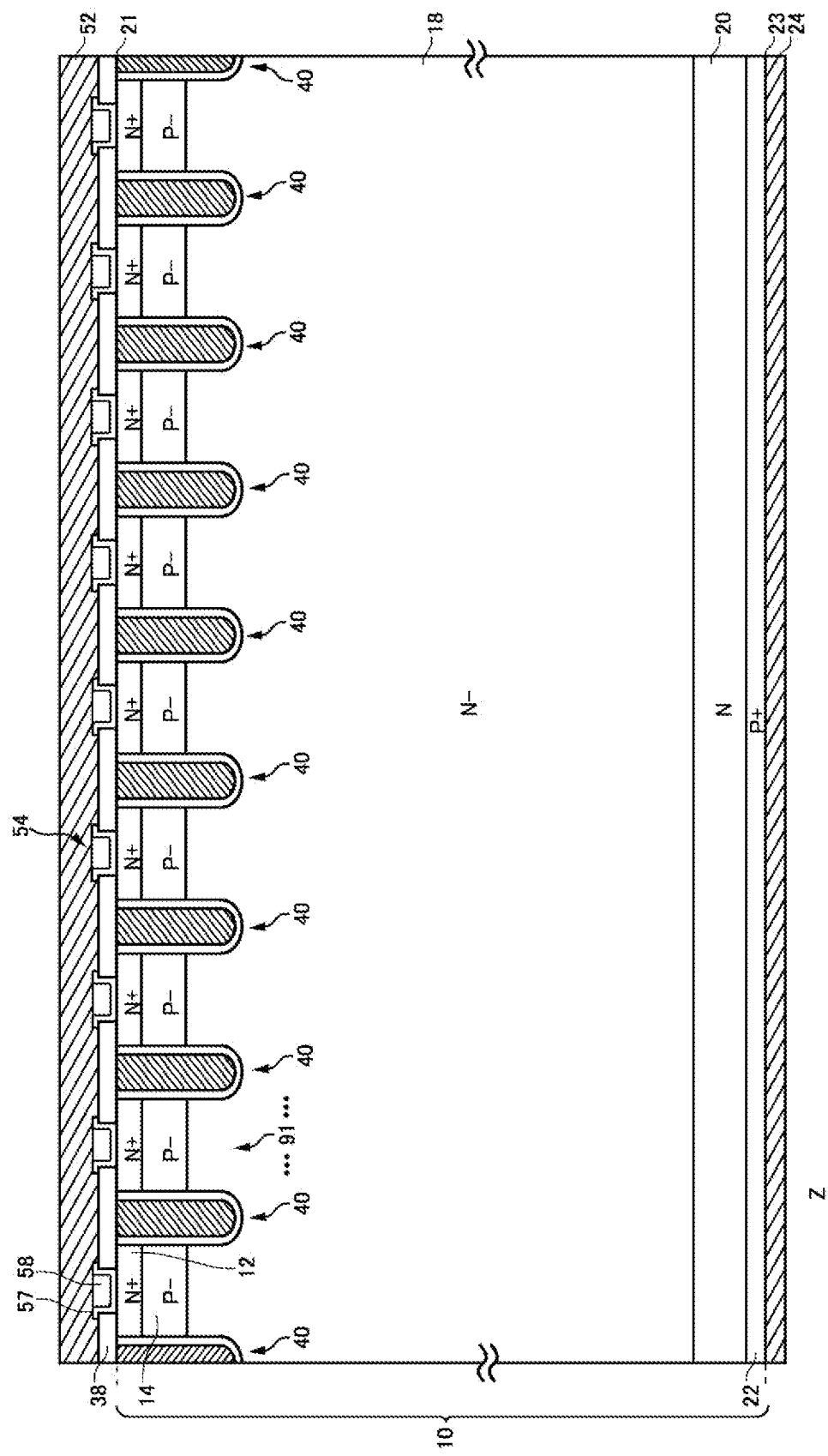
FIG. 14 shows an example of a cross-sectional view of a current sense section 210.

FIG. 14 shows an example of a cross-sectional view of the current sense section 210. In FIG. 14, a YZ cross-section passing the emitter region 12 is shown. In the current sense section 210 of the present example, the gate trench sections 40 are consecutively aligned in the Y-axis direction, and the emitter trench section 60 is not provided. That is, all the trench sections in the current sense section 210 of the present example are the gate trench sections 40. In this case, the gate emitter ratio of the current sense section 210 is I/O and is thus an infinite value. Also in the current sense section 210 of the present example, some emitter trench sections 60 may be provided at both end portions in the alignment direction (in the Y-axis direction) of the trench sections. The gate emitter ratio of the current sense section 210 may be two times or greater or ten times or greater as large as the gate emitter ratio of the transistor section 70.

Also, in each of the current sense section 210 and the transistor section 70, a value obtained by dividing an area of the accumulation region 16 by an area of the emitter region 12, as seen from above, is referred to as an area ratio of the accumulation region 16. That is, the area ratio of the accumulation region 16 in the current sense section 210 is a value obtained by dividing a total area of the accumulation regions 16 included in the current sense section 210 by a total area of the emitter regions 12 included in the current sense section 210, as seen from above. Similarly, the area ratio of the accumulation region 16 in the transistor section 70 is a value obtained by dividing a total area of the accumulation regions 16 included in the transistor section 70 by a total area of the emitter regions 12 included in the transistor section 70, as seen from above.

The area ratio of the accumulation region 16 in the current sense section 210 is preferably smaller than the area ratio of the accumulation region 16 in the transistor section 70. When the area ratio of the accumulation regions 16 included in the current sense section 210 is reduced, it is possible to reduce the IE effect in the current sense section 210 and to suppress reduction in clamp voltage due to accumulation of minority carriers. Therefore, for example, even when the voltage is clamped in the transistor section 70 during the turn-off operation, it is possible to suppress occurrence of avalanche in the current sense section 210, thereby suppressing the breakdown of the current sense section 210. Also, when the area ratio of the accumulation regions 16 in the current sense section 210 is reduced, it is possible to suppress a voltage waveform in the current sense section 210 from varying excessively sharply. For this reason, it is possible to suppress unbalance of an operation in the current sense section 210, thereby suppressing the breakdown of the current sense section 210.

In the example of FIG. 13, the transistor section 70 is provided with both the emitter region 12 and the accumulation region 16. In the example of FIG. 14, the current sense section 210 is provided with the emitter region 12 but is not provided with the accumulation region 16. That is, the area ratio of the accumulation region 16 in the current sense section 210 shown in FIG. 14 is zero. The area ratio of the accumulation region 16 in the current sense section 210 may be a half or less or ¹/₁₀ or less of the area ratio of the accumulation region 16 in the transistor section 70.

Figure 15:
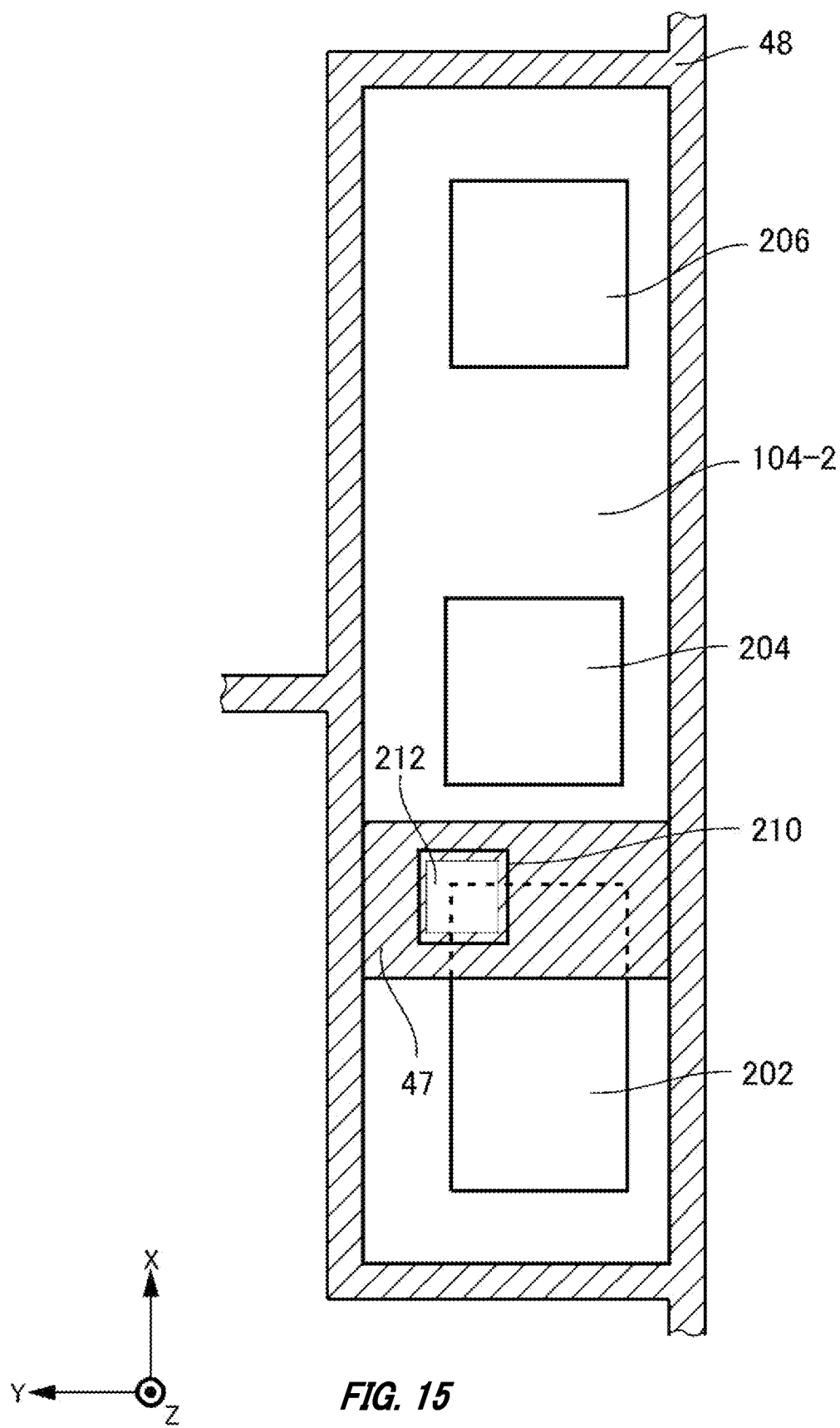
FIG. 15 is an enlarged top view in the vicinity of an outer region 104-2.

FIG. 15 is an enlarged top view in the vicinity of the outer region 104-2. As described above, the gate runner 48 is provided to surround the outer region 104-2. The gate runner 48 of the present example has a traversing part 47 provided to traverse the outer region 104-2, as seen from above. The traversing part 47 of the present example is formed to traverse the outer region 104-2 in the Y-axis direction. The traversing part 47 is formed to connect the two gate runners 48 provided along both ends of the outer region 104-2 in the Y-axis direction. The traversing part 47 may be provided without overlapping the anode pad 204 and the cathode pad 206.

The gate wire section 46 has an opening portion 212 formed to penetrate the gate wire section 46 from an upper surface to a lower surface. In the present example, the traversing part 47 of the gate runners 48 is formed with the opening portion 212. The opening portion 212 is formed to penetrate the gate runner 48 of polysilicon. In FIG. 15, a region of the gate runner 48 except the opening portion 212 is obliquely hatched.

The current sense section 210 is arranged in a region in which at least a part overlaps the opening portion 212 below the gate runner 48. The current sense section 210 may be arranged with at least a part overlapping a region of the gate runner 48 except the opening portion 212. In the example of FIG. 15, the current sense section 210 is entirely arranged with overlapping the opening portion 212 or the gate runner 48. The current sense section 210 is arranged below the gate runner 48, so that it is possible to easily interconnect the gate trench section 40 of the current sense section 210 and the gate runner 48.

Also, at least a part of the current sense section 210 is exposed by the opening portion 212, so that it is possible to easily interconnect the current sense section 210 and the current sense pad 202. At least a part of the current sense pad 202 may be provided in the opening portion 212. The current sense pad 202 of the present example may be provided with extending from a position, in which it does not overlap the gate runner 48, to the opening portion 212 through above the gate runner 48. In FIG. 15, a part, which is provided above the gate runner 48, of the current sense pad 202 is shown with the broken line. The current sense pad 202 and the gate runner 48 are insulated from each other by an interlayer dielectric film or the like. The current sense pad 202 may be provided to cover the entire opening portion 212.

Figure 16:
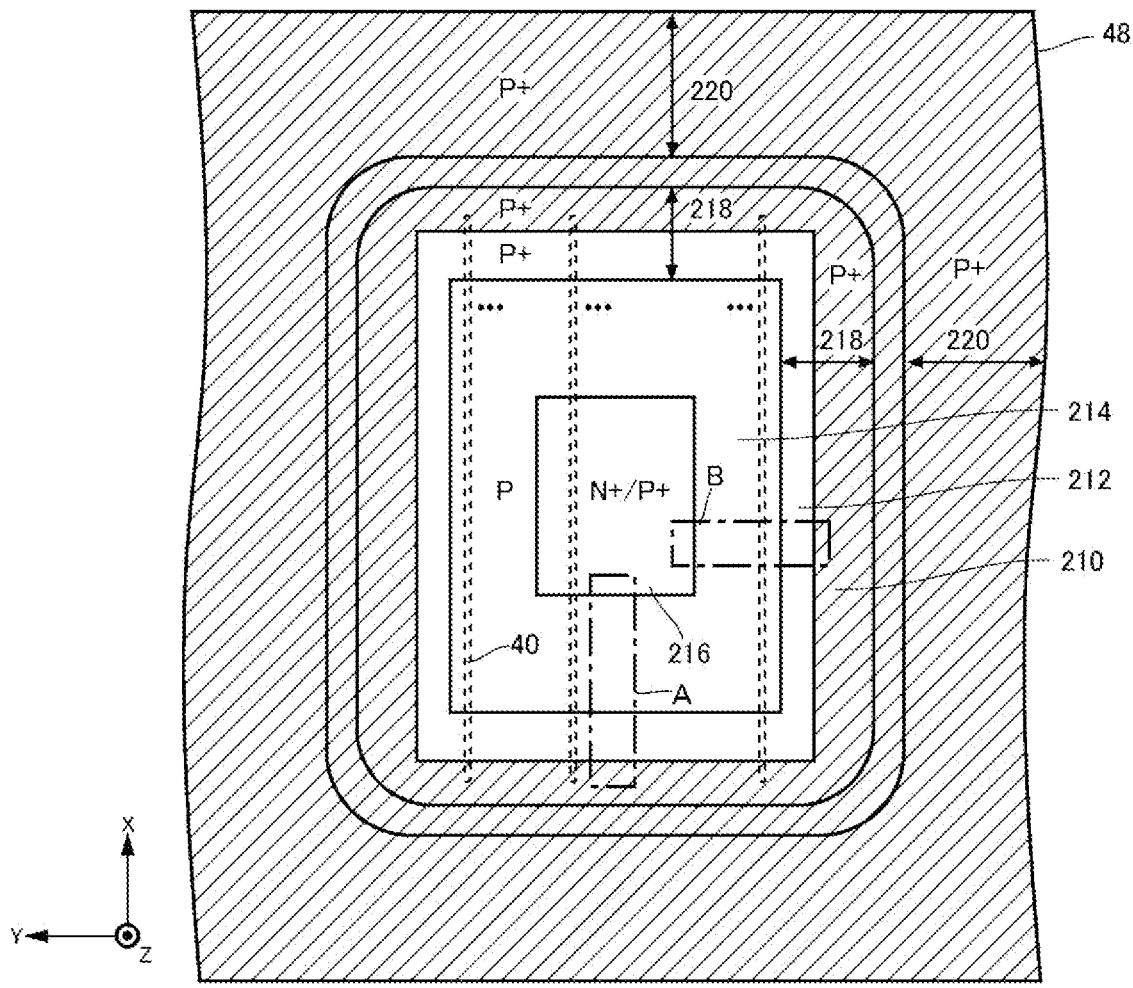
FIG. 16 is an enlarged top view in the vicinity of an opening portion 212.

FIG. 16 is an enlarged top view in the vicinity of the opening portion 212. In FIG. 16, the current sense pad 202 is omitted. In the present example, the semiconductor substrate 10 is provided with a first well region 220 and a second well region 218. The first well region 220 and the second well region 218 are P+ type regions provided from the upper surface of the semiconductor substrate 10 to a part deeper than a lower end of the trench section. The first well region 220 corresponds to the well region 11 of the semiconductor device 100 described with reference to FIGS. 1A to 11.

The first well region 220 is provided to surround the transistor section 70 (the transistor section 70 and the diode section 80 when the diode section 80 is provided), as seen from above. The second well region 218 is provided to surround the current sense section 210, as seen from above. In the present example, the second well region 218 is formed as a part of the current sense section 210. That is, an outer peripheral end of the second well region 218, as seen from above, coincides with an outer peripheral end of the current sense section 210, as seen from above.

The first well region 220 and the second well region 218 are arranged with separating from each other. For example, an N type region such as the drift region 18 may be provided between the first well region 220 and the second well region 218.

The current sense section 210 of the present example has an emitter arrangement region 216 and an emitter non-arrangement region 214. The emitter arrangement region 216 is a region in which the emitter regions 12 are periodically arranged, as seen from above. For example, as shown in FIG. 1A and the like, the emitter region 12 and the contact region 15 are alternately arranged in the X-axis direction in the emitter arrangement region 216. The emitter arrangement region 216 may be a region including a center of the current sense section 210, as seen from above.

The emitter non-arrangement region 214 is a region in which the emitter region 12 is not provided. A P type region may be exposed to an upper surface of the emitter non-arrangement region 214. The P type region may have the same doping concentration as the contact region 15, the same doping concentration as the base region 14 or another doping concentration.

The emitter non-arrangement region 214 is provided to surround the emitter arrangement region 216, as seen from above. As an example, the emitter arrangement region 216 and the emitter non-arrangement region 214 have a rectangular outer shape, respectively, as seen from above. The emitter non-arrangement region 214 is surrounded by the second well region 218, as seen from above.

In the emitter arrangement region 216 and the emitter non-arrangement region 214, the trench sections such as the gate trench section 40 and each of the mesa sections are arranged. In FIG. 16, some of the trench sections are shown with the broken line. Each of the trench sections is provided with extending in the X-axis direction. When the emitter arrangement region 216 and the emitter non-arrangement region 214 are arranged side by side in the X-axis direction, the trench sections may be provided continuously over both the emitter arrangement region 216 and the emitter non-arrangement region 214. The end portions of the gate trench section 40 in the X-axis direction may be provided inside the second well region 218. Thereby, it is possible to lessen the electric field concentration on the end portions of the gate trench section 40.

The end portions of the gate trench section 40 in the X-axis direction are preferably provided in positions in which they overlap the gate runner 48. That is, the end portions of the gate trench section 40 are preferably arranged outside the opening portion 212. Thereby, it is possible to easily interconnect the gate trench section 40 and the gate runner 48.

The emitter arrangement region 216 and the emitter non-arrangement region 214 may be entirely exposed by the opening portion 212. Thereby, the emitter arrangement region 216 and the emitter non-arrangement region 214 can be entirely connected to the current sense pad 202.

In the example of FIG. 16, as seen from above, end portions of the opening portion 212 are arranged above the second well region 218. In another example, the end portions of the opening portion 212 may be arranged above the emitter non-arrangement region 214.

Figure 17:
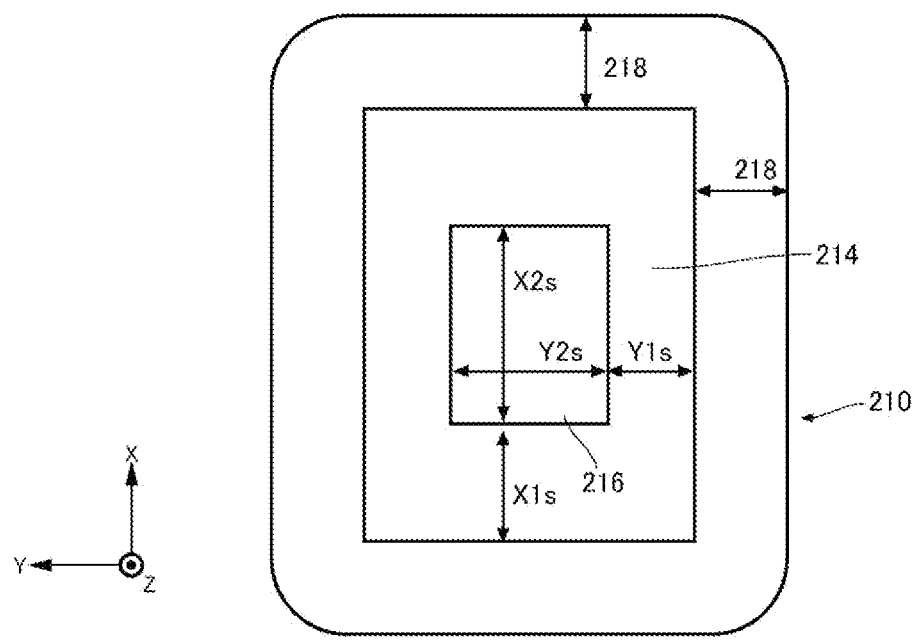
FIG. 17 is a top view illustrating distances of a second well region 218 and an emitter arrangement region 216.

FIG. 17 is a top view illustrating distances of the second well region 218 and the emitter arrangement region 216. In FIG. 17, the structures except the second well region 218, the emitter arrangement region 216 and the emitter non-arrangement region 214 are omitted.

In the X-axis direction, a shortest distance between the emitter arrangement region 216 and the second well region 218 is referred to as $X1s$, and a length of the emitter arrangement region 216 is referred to as $X2s$. The distance $X1s$ is the shortest distance between the emitter region 12, which is arranged on the outermost side in the X-axis direction in the emitter arrangement region 216, and the second well region 218. The length X2s is a maximum distance in the X-axis direction between the emitter regions 12 arranged at both ends in the X-axis direction in the emitter arrangement region 216.

In the Y-axis direction, a shortest distance between the emitter arrangement region 216 and the second well region 218 is referred to as Y1s, and a length of the emitter arrangement region 216 is referred to as Y2s. The distance Y1s is the shortest distance between the emitter region 12, which is arranged on the outermost side in the Y-axis direction in the emitter arrangement region 216, and the second well region 218. The length Y2s is a maximum distance between the emitter regions 12 arranged at both ends in the Y-axis direction in the emitter arrangement region 216.

The current sense section 210 of the present example has a greater gate emitter ratio, as compared to the transistor section 70. For this reason, as compared to a case in which the current sense section has the same gate emitter ratio as the transistor section 70, it is possible to secure an equivalent channel area even when the area of the emitter arrangement region 216 is reduced. Since it is possible to reduce the area of the emitter arrangement region 216, it is possible to increase the distances X1s and Y1s between the second well region 218 and the emitter region 12, and to easily separate the current flowing through the current sense section 210 and the current flowing through another region.

As an example, the distance X1s may be 10% or greater or 20% or greater of the length X2s. The distance Y1s may be 10% or greater, 20% or greater or 30% or greater of the width Y2s.

Figure 18:
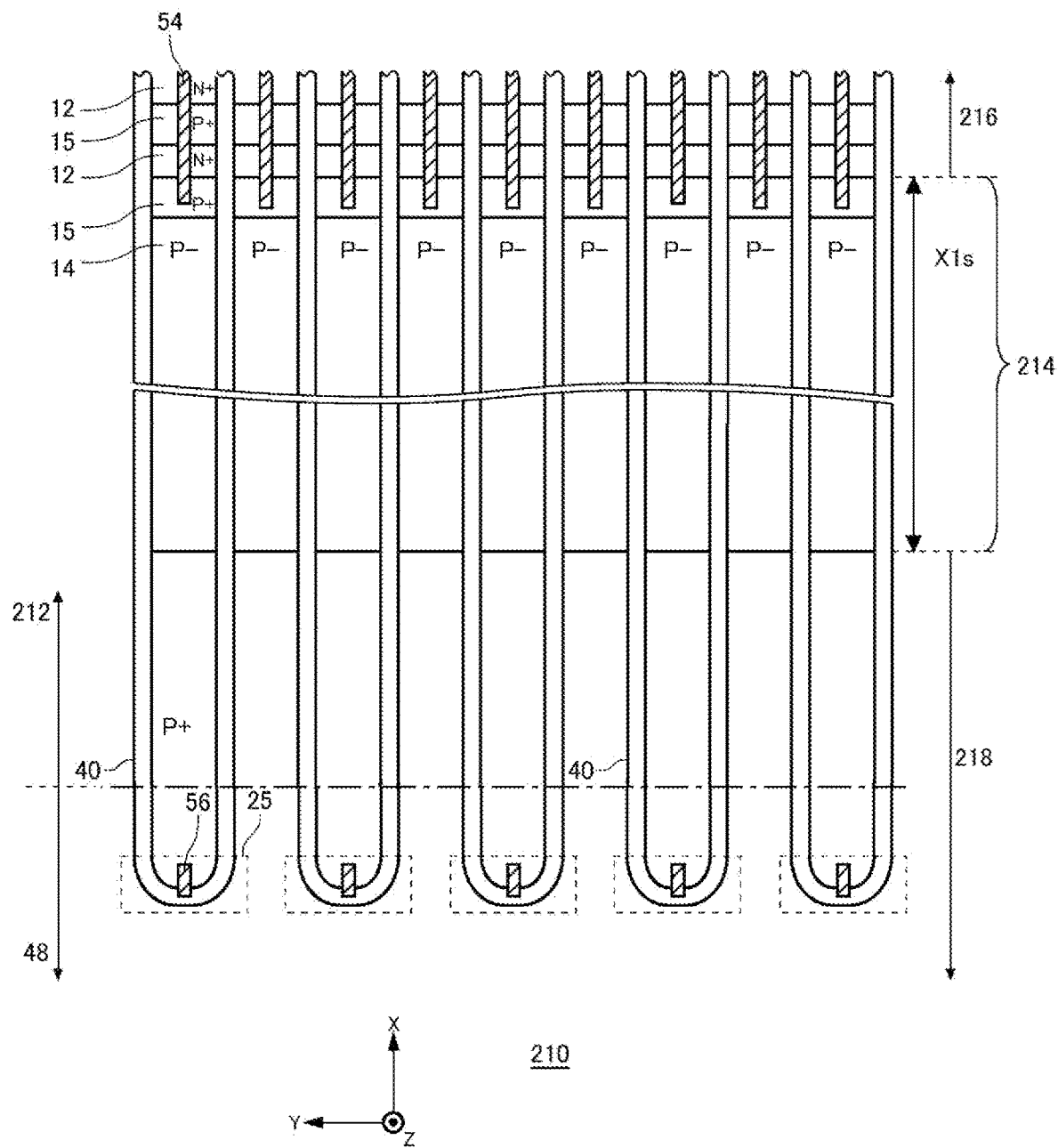
FIG. 18 illustrates a distance X1$s$.

FIG. 18 illustrates the distance X1s. FIG. 18 is a top view showing an outline of a region A in FIG. 16. The region A is a region including the emitter arrangement region 216, the emitter non-arrangement region 214 and the second well region 218 arranged side by side in the X-axis direction.

As described above, the distance X1s is the shortest distance between the emitter region 12, which is arranged on the outermost side in the X-axis direction, and the second well region 218. At least one of the contact region 15 and the base region 14 may be provided between the emitter region 12 and the second well region 218. In the example of FIG. 18, the base region 14 is arranged over a half or greater of a region between the outermost emitter region 12 and the second well region 218 in the X-axis direction. In another example, the contact region 15 may be arranged over the half or greater of the region between the outermost emitter region 12 and the second well region 218 in the X-axis direction. In the meantime, the base region 14 or the contact region 15 may be arranged over the entire region between the outermost emitter region 12 and the second well region 218 in the X-axis direction.

Figure 19:
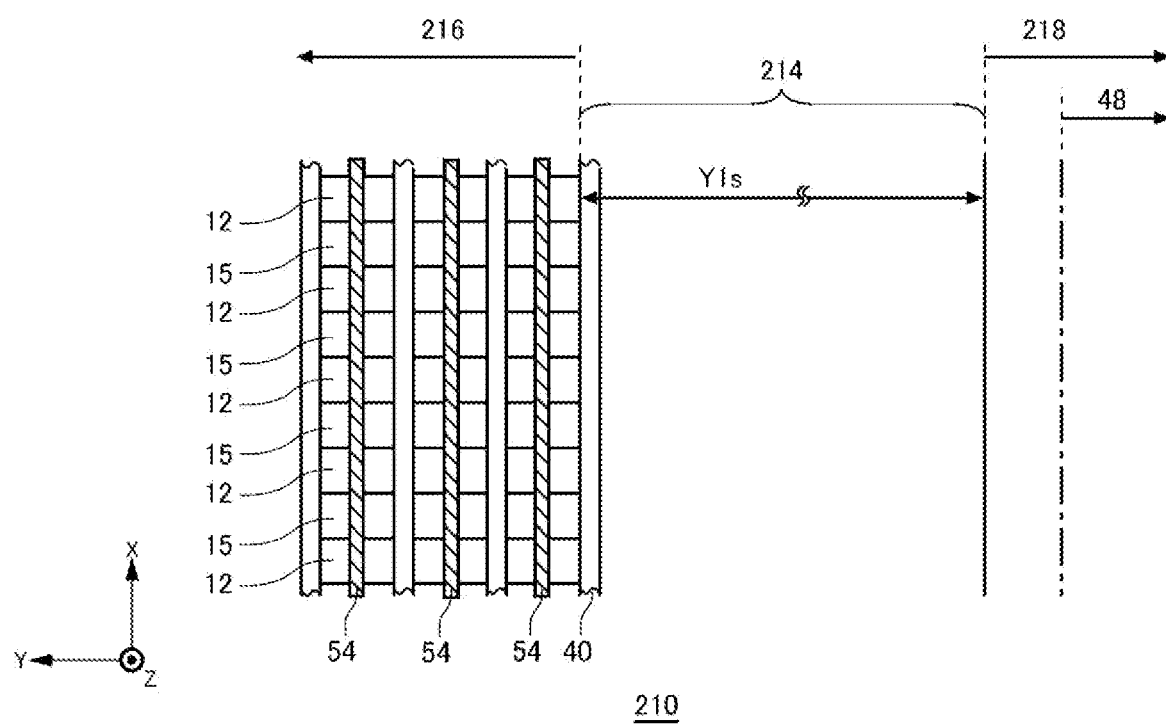
FIG. 19 illustrates a distance Y1$s$.

FIG. 19 illustrates the distance Y1s. FIG. 19 is a top view showing an outline of a region B in FIG. 16. The region B is a region including the emitter arrangement region 216, the emitter non-arrangement region 214 and the second well region 218 arranged side by side in the Y-axis direction.

As described above, the distance Y1s is the shortest distance between the emitter region 12, which is arranged on the outermost side in the Y-axis direction, and the second well region 218. At least one of the contact region 15 and the base region 14 may be provided between the emitter region 12 and the second well region 218. In the meantime, as shown in FIG. 16 in which some of the trench sections are shown with the broken line, the gate trench section 40 or emitter trench section 60 extending in the X-axis direction may be provided within a range of the distance Y1s of the present example.

Figure 20:
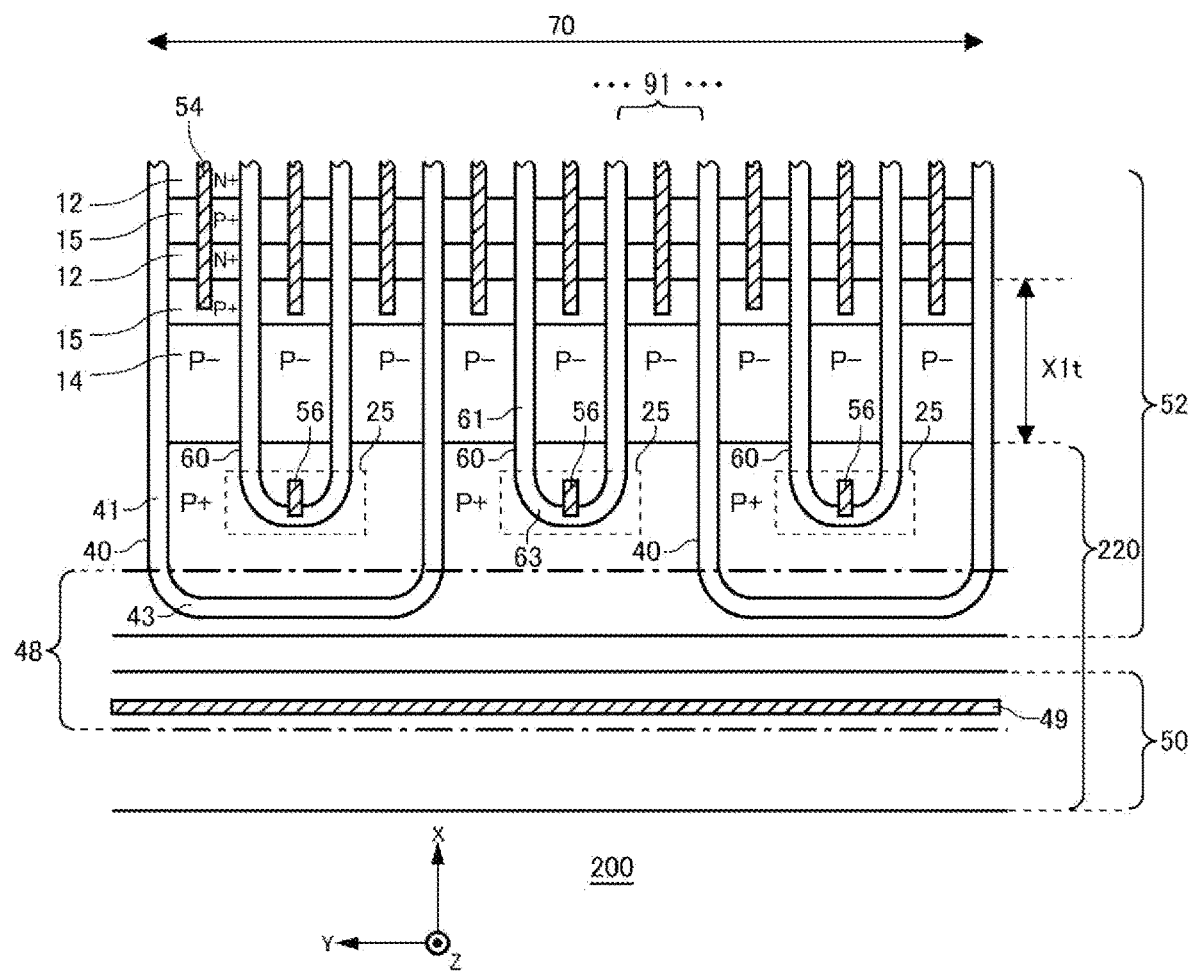
FIG. 20 illustrates a distance X1$t$ in the transistor section 70.

FIG. 20 illustrates a distance X1t in the transistor section 70. FIG. 20 is a partial top view of the transistor section 70. The distance X1t is the shortest distance in the X-axis direction between the outermost emitter region 12 in the X-axis direction and the first well region 220, in the transistor section 70.

The distance X1s in the current sense section 210 shown in FIG. 18 may be greater than the distance X1t in the transistor section 70. As described above, when the distance X1s in the current sense section 210 is increased, it is possible to easily separate the current flowing through the current sense section 210 and the current flowing through another region. The distance X1s may be two times or greater or five times or greater as large as the distance X1t.

Figure 21:
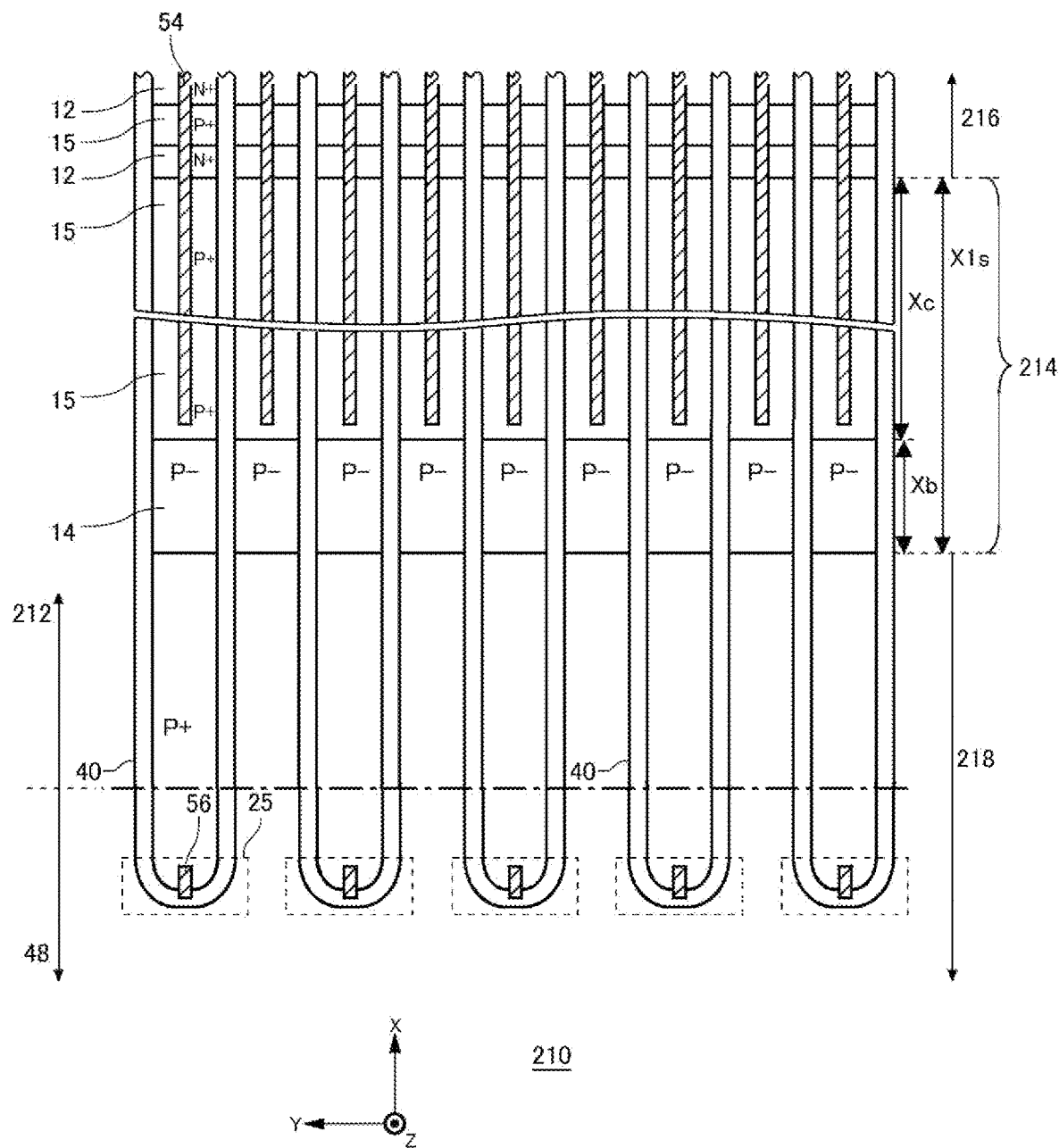
FIG. 21 shows another configuration example of a region A of FIG. 16.

FIG. 21 shows another configuration example of the region A of FIG. 16. In FIG. 21, a length of the base region 14 in the X-axis direction, which is in contact with the second well region 218 of the current sense section 210, is denoted as Xb, and a distance between the outermost emitter region 12 and the base region 14 is denoted as Xc. Also in the present example, the distance X1s in the current sense section 210 is greater than the distance X1t in the transistor section 70.

In the example of FIG. 18, the length Xb of the base region 14 in contact with the second well region 218 of the current sense section 210 is greater than a length of the base region 14 in contact with the first well region 220 of the transistor section 70. That is, the base region 14 of the current sense section 210 is made longer than the base region of the transistor section 70, so that the distance X1s between the second well region 218 and the outermost emitter region 12 is increased.

In the present example, the distance Xc between the outermost emitter region 12 and the base region 14 in contact with the second well region 218 is made greater than the distance between the outermost emitter region 12 in the transistor section 70 and the base region 14 in contact with the first well region 218. Thereby, the distance X1s in the current sense section 210 can be made greater than the distance X1t in the transistor section 70.

In the meantime, in the current sense section 210, the contact region 15 may be provided between the outermost emitter region 12 and the base region 14 in contact with the first well region 218. That is, the distance Xc is a length of the contact region 15 arranged between the outermost emitter region 12 and the base region 14 in contact with the first well region 218. The length Xc of the outermost contact region 15 in the X-axis direction in the current sense section 210 may be greater than the length of the outermost contact region 15 in the X-axis direction in the transistor section 70.

Figure 22:
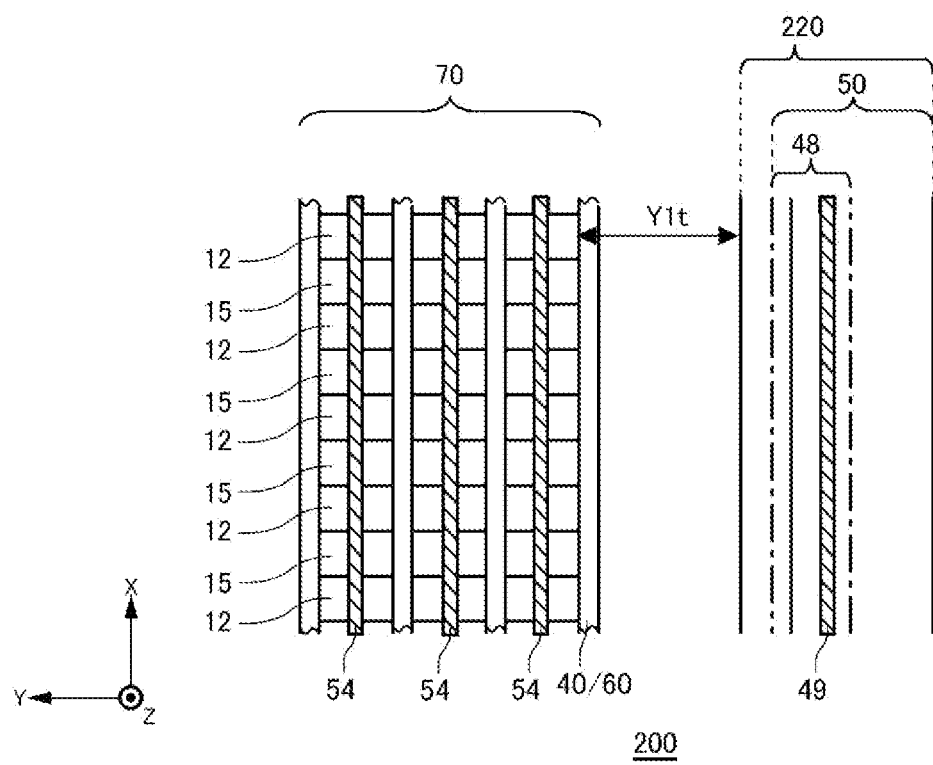
FIG. 22 illustrates a distance Y1$t$ in the transistor section 70.

FIG. 22 illustrates a distance Y1t in the transistor section 70. FIG. 22 is a partial top view of the transistor section 70. The distance Y1t is a shortest distance in the Y-axis direction between the outermost emitter region 12 in the Y-axis direction in the transistor section 70 and the first well region 220. In the meantime, like FIG. 19, the gate trench section 40 or emitter trench section 60 extending in the X-axis direction may be provided within a range of the distance Y1t of the present example.

The distance Y1s in the current sense section 210 shown in FIG. 19 may be greater than the distance Y1t in the transistor section 70. As described above, when the distance Y1s in the current sense section 210 is increased, it is possible to easily separate the current flowing through the current sense section 210 and the current flowing through another region. The distance Y1s may be two times or greater or five times or greater as large as the distance Y1t.

In the meantime, the current sense section 210 of the semiconductor device 200 may be provided with the lower surface lifetime killer 96, like the transistor section 70. Also, the current sense section 210 may be provided with the upper surface lifetime killer 95. For example, when the transistor section 70 is provided with the upper surface lifetime killer 95, the current sense section 210 is also provided with the upper surface lifetime killer 95.

Although the present invention has been described with reference to the embodiments, the technical scope of the present invention is not limited to the scope described in the embodiments. It is obvious to one skilled in the art that the embodiments can be diversely changed or improved. It is also obvious from the claims that the changes or improvements can also be included within the technical scope of the present invention.

In the specification and drawings, aspects described in each of following items are also disclosed.

(Item 1)

A semiconductor device having a transistor section and a diode section may include a boundary region formed in a region in which the transistor section and the diode section are adjacent to each other, and provided so as to prevent interference between the transistor section and the diode section.

The transistor section and the diode section may include a plurality of trench sections aligned in a preset alignment direction.

The diode section may include a first conductivity-type cathode region on an opposite surface side to a surface side of the semiconductor substrate.

A width of the diode section in the alignment direction may be greater than a width of the transistor section in the alignment direction.

The cathode region may be provided with extending to the boundary region in the alignment direction.

(Item 2)

In Item 1, the width of the diode section in the alignment direction may be equal to or greater than 1,500 μm.

(Item 3)

In Item 1 or 2, the semiconductor device may have a plurality of transistor sections and a plurality of diode sections.

A total area of the plurality of diode sections may be greater than a total area of the plurality of transistor sections.

(Item 4)

In one of Item 1 to Item 3, the semiconductor device may further include:
a gate metal layer provided above an upper surface of the semiconductor substrate,
an emitter electrode provided above the upper surface of the semiconductor substrate,
a first conductivity-type emitter region provided on the upper surface side of the semiconductor substrate in the transistor section,
gate trench sections provided on the upper surface side of the semiconductor substrate in the transistor section, electrically connected to the gate metal layer and being in contact with the emitter region, and
emitter trench sections provided on the upper surface side of the semiconductor substrate in the diode section and electrically connected to the emitter electrode.

The emitter trench sections may be arranged at predetermined pitches between the gate trench sections, also in the transistor section.

(Item 5)

In Item 4, the semiconductor device may further include a dummy trench section provided on the upper surface side of the semiconductor substrate, electrically connected to the gate metal layer, and being not in contact with the emitter region.

(Item 6)

In one of Item 1 to Item 5, the boundary region may be a region having a device structure different from a device structure of the transistor section and a device structure of the diode section.

(Item 7)

In one of Item 1 to Item 6, the semiconductor device may further include:
an interlayer dielectric film provided above the upper surface side of the semiconductor substrate, and
contact holes provided in the interlayer dielectric film between the trench sections in the transistor section and the diode section, an emitter electrode being embedded in the contact holes.

The interlayer dielectric film between the trench sections in the boundary region may not be formed with the contact hole.

(Item 8)

In one of Item 1 to Item 7, the diode section may have the boundary region and a non-boundary region.

A concentration of the cathode region in the boundary region of the diode section may be higher than a concentration of the cathode region in the non-boundary region of the diode section.

(Item 9)

In one of Item 1 to Item 8, the semiconductor device may further include a lower surface lifetime killer provided on an opposite side to the upper surface side of the semiconductor substrate.

The diode section may have the boundary region and a non-boundary region.

A concentration of the lower surface lifetime killer in the boundary region of the diode section may be lower than a concentration of the lower surface lifetime killer in the non-boundary region of the diode section.

(Item 10)

In one of Item 1 to Item 9, the semiconductor device may further include an upper surface lifetime killer introduced into a non-boundary region of at least the diode section on the upper surface side of the semiconductor substrate.

The cathode region may further extend toward the transistor section than the upper surface lifetime killer.

The operations, procedures, steps, and stages of each process performed by an apparatus, system, program, and method shown in the claims, specification and drawings can be performed in any order as long as the order is not explicitly indicated by "prior to," "before," or the like and as long as the output from a previous process is not used in a later process. Even if the process flow is described using phrases such as "first" or "next" in the claims, specification and drawings, it does not necessarily mean that the process must be performed in this order.

REFERENCE SIGNS LIST

10 . . . semiconductor substrate, 11 . . . well region, 12 . . . emitter region, 14 . . . base region, 15 . . . contact region, 16 . . . accumulation region, 18 . . . drift region, 20 . . . buffer region, 21 . . . upper surface, 22 . . . collector region, 23 . . . lower surface, 24 . . . collector electrode, 25 . . . connection section, 30 . . . dummy trench section, 31 . . . extension part, 32 . . . dummy insulating film, 33 . . . connection part, 34 . . . dummy conductive section, 38 . . . interlayer dielectric film, 40 . . . gate trench section, 41 . . . extension part, 42 . . . gate insulating film, 43 . . . connection part, 44 . . . gate conductive section, 46 . . . gate wire section, 47 . . . traversing part, 48 . . . gate runner, 49 . . . contact hole, 50 . . . gate metal layer, 52 . . . emitter electrode, 54 . . . contact hole, 56 . . . contact hole, 57 . . . barrier metal, 58 . . . tungsten plug, 60 . . . emitter trench section, 61 . . . extension part, 62 . . . emitter insulating film, 63 . . . connection part, 64 . . . emitter conductive section, 70 . . . transistor section, 80 . . . diode section, 81 . . . boundary region, 82 . . . cathode region, 83 . . . non-boundary region, 84 . . . edge neighboring region, 91 . . . first mesa section, 92 . . . second mesa section, 93 . . . third mesa section, 95 . . . upper surface lifetime killer, 96 . . . lower surface lifetime killer, 100 . . . semiconductor device, 102 . . . edge termination region, 104 . . . outer region, 200 . . . semiconductor device, 202 . . . current sense pad, 204 . . . anode pad, 206 . . . cathode pad, 208 . . . gate pad, 210 . . . current sense section, 212 . . . opening portion, 214 . . . emitter non-arrangement region, 216 . . . emitter arrangement region, 218 . . . second well region, 220 . . . first well region, 500 . . . semiconductor device, 570 . . . transistor section, 580 . . . diode section

What is claimed is:

1. A semiconductor device having a first trench portion repetitive region and a second trench portion repetitive region, the semiconductor device comprising:
    a gate metal layer provided above an upper surface of a semiconductor substrate;
    an emitter electrode provided above the upper surface of the semiconductor substrate;
    a first conductivity-type emitter region provided on an upper surface side of the semiconductor substrate at least in the first trench portion repetitive region;
    one or more gate trench sections provided on the upper surface side of the semiconductor substrate at least in the first trench portion repetitive region, electrically connected to the gate metal layer and being in contact with the emitter region;
    one or more emitter trench sections provided on the upper surface side of the semiconductor substrate in the first trench portion repetitive region and the second trench portion repetitive region and electrically connected to the emitter electrode; and
    one or more dummy trench sections provided on the upper surface side of the semiconductor substrate, electrically connected to the gate metal layer and being not in contact with the emitter region.

2. The semiconductor device according to claim 1, wherein
    each of the gate trench section, the emitter trench section and the dummy trench section includes a trench structure, and
    the trench structure includes a trench formed on the upper surface side of the semiconductor substrate; an insulating film formed to cover an inner wall of the trench; and a conductive material provided at an inner side of the insulating film.

3. The semiconductor device according to claim 2, wherein
    a device structure of the first trench portion repetitive region is different from that of the second trench portion repetitive region.

4. The semiconductor device according to claim 2, wherein
    the first trench portion repetitive region is a region in which the trench structure is repeated in a first pattern, and
    the second trench portion repetitive region is a region in which the trench structure is repeated in a second pattern.

5. The semiconductor device according to claim 4, wherein
    the first pattern is different from the second pattern in at least one of the trench sections.

6. The semiconductor device according to claim 4, wherein
    the emitter trench section is provided on each side of the gate trench section in an alignment direction of the trench structure in the first pattern.

7. The semiconductor device according to claim 6, wherein
    two of the emitter trench sections are arranged on each side of the gate trench section in the alignment direction of the trench structure in the first pattern.

8. The semiconductor device according to claim 4, wherein
    the trench emitter section is repeatedly arranged in an alignment direction in the second pattern.

9. The semiconductor device according to claim 4, wherein
    a number of the gate trench section is identical to a number of the emitter trench section in the first pattern.

10. The semiconductor device according to claim 4, wherein
    a number of the gate trench section is less than a number of the emitter trench section in the first pattern.

11. The semiconductor device according to claim 2, wherein
    the first trench portion repetitive region is a region in which the trench structure is repeated in a first period, and
    the second trench portion repetitive region is a region in which the trench structure is repeated in a second period.

12. The semiconductor device according to claim 2, further comprising: a dummy trench mesa section positioned between two of the dummy trench sections.

13. The semiconductor device according to claim 12, wherein
    the dummy trench mesa section is positioned between the first trench portion repetitive region and the second trench portion repetitive region.

14. The semiconductor device according to claim 13, further comprising:
    an interlayer dielectric film provided above the upper surface of the semiconductor substrate; and
    a contact holes for electrically interconnecting the emitter electrode and the semiconductor substrate; wherein
    an upper surface of the dummy trench mesa section is covered by the interlayer dielectric film in a cross section of the trench section in an alignment direction passing the emitter region.

15. The semiconductor device according to claim 1, wherein the dummy trench section is provided between the first trench portion repetitive region and the second trench portion repetitive region.

16. The semiconductor device according to claim 1, wherein
the dummy trench section is provided in the first trench portion repetitive region or in the second trench portion repetitive region.

17. The semiconductor device according to claim 1, further comprising:
an edge termination region; and
an edge neighboring region adjacent to the edge termination region, wherein
the edge neighboring region is adjacent to the first trench portion repetitive region, and
the dummy trench section is provided in the edge neighboring region.

18. The semiconductor device according to claim 1, wherein
when a number of the gate trench section is denoted as G and a number of the dummy trench section is denoted as D, a relationship of $0.01<D/(D+G)<0.2$ is satisfied.

19. The semiconductor device according to claim 1, wherein
the gate trench section, the emitter trench section and the dummy trench section are aligned in a preset alignment direction, and
a width of the second trench portion repetitive region in the alignment direction is greater than a width of the first trench portion repetitive region in the alignment direction.

20. The semiconductor device according to claim 1, further comprising:
a first plug for electrically interconnecting the gate trench section and the gate metal layer in the first trench portion repetitive region,
wherein the first plug includes tungsten.

21. The semiconductor device according to claim 1, further comprising:
a second plug for electrically interconnecting the emitter trench section and the emitter electrode in the second trench portion repetitive region,
wherein the second plug includes tungsten.

22. The semiconductor device according to claim 5, wherein
the emitter trench section is arranged on each side of the gate trench section in an alignment direction of the trench section in the first pattern.

23. The semiconductor device according to claim 22, wherein
two of the emitter trench sections are arranged on each side of the gate trench section in an alignment direction of the trench section in the first pattern.

24. The semiconductor device according to claim 5, wherein
the emitter trench section is repeatedly arranged in an alignment direction in the second pattern.

25. The semiconductor device according to claim 5, wherein
a number of the gate trench section is identical to a number of the emitter trench section in the first pattern.

26. The semiconductor device according to claim 5, wherein
a number of the gate trench section is less than a number of the emitter trench section in the first pattern.

27. The semiconductor device according to claim 3, wherein
the first trench portion repetitive region is a region in which the trench structure is repeated in a first pattern, and
the second trench portion repetitive region is a region in which the trench structure is repeated in a second pattern.

28. The semiconductor device according to claim 3, wherein
the first trench portion repetitive region is a region in which the trench structure is repeated in a first period, and
the second trench portion repetitive region is a region in which the trench structure is repeated in a second period.

29. The semiconductor device according to claim 1, wherein
the semiconductor device includes a drift region of the first conductivity type,
each of the one or more dummy trench sections includes two extension parts,
the emitter electrode is in electrical contact with a contact region between the two extension parts of each of the one or more dummy trench sections,
the contact region is of a second conductivity type that is opposite the first conductivity type, and
the upper surface of the semiconductor substrate between the two extension parts of each of the one or more dummy trench sections is devoid of the emitter region.

* * * * *